United States Patent [19]

Mateika et al.

[11] Patent Number: 5,302,559
[45] Date of Patent: Apr. 12, 1994

[54] MIXED CRYSTALS OF DOPED RARE EARTH GALLIUM GARNET

[75] Inventors: Dieter Mateika, Ellerbek; Erich Volkel, Hamburg, both of Fed. Rep. of Germany; Jan Haisma, Valkenswaard, Netherlands

[73] Assignee: U.S. Philips Corporation, New York, N.Y.

[21] Appl. No.: 896,489

[22] Filed: Jun. 2, 1992

Related U.S. Application Data

[63] Continuation of Ser. No. 480,693, Feb. 14, 1992, abandoned.

Foreign Application Priority Data

Feb. 17, 1989 [DE] Fed. Rep. of Germany ....... 3904868

[51] Int. Cl.⁵ .................. C04B 35/60; C04B 35/00
[52] U.S. Cl. .................... 501/86; 501/152; 501/126; 501/123; 501/102; 501/108; 252/62.3 GA; 156/DIG. 63; 156/DIG. 78; 156/DIG. 95; 156/620.5
[58] Field of Search .......... 156/DIG. 63, DIG. 78, 156/DIG. 95, 620.5; 252/62.3 GA; 501/86, 152, 102, 108, 123, 126

[56] References Cited

U.S. PATENT DOCUMENTS

| | | | |
|---|---|---|---|
| 3,951,729 | 4/1976 | Takagi et al. | 156/DIG. 63 |
| 3,959,006 | 5/1976 | Herrnring et al. | 156/DIG. 63 |
| 4,199,396 | 4/1980 | Brandle et al. | 156/620.2 |
| 4,233,270 | 11/1980 | Schmidt | 156/620.2 |
| 4,302,280 | 11/1981 | Bruni | 156/DIG. 63 |
| 4,350,559 | 9/1982 | Boudot et al. | 156/DIG. 63 |
| 4,379,853 | 4/1983 | Mateika et al. | 156/DIG. 63 |
| 4,429,052 | 1/1984 | Mateika et al. | 423/594 |
| 4,434,212 | 2/1984 | Robertson et al. | 156/DIG. 63 |
| 4,454,206 | 6/1984 | Mateika et al. | 156/DIG. 63 |

FOREIGN PATENT DOCUMENTS

| | | |
|---|---|---|
| 170309 | 2/1986 | European Pat. Off. |
| 1-179791 | 7/1989 | Japan |
| 2-94608 | 4/1990 | Japan |

OTHER PUBLICATIONS

Mateika et al., "Lattice Parameters and Distribution Coefficents as Function of Ca, Mg and Zr ... Garnets", Jour. of Crystal Growth, vol. 56 (1982) pp. 677-689.

Mateika et al, "Growth and Investigation of $\{Gd_{3-x}Ca_x\}[Ga_{2-y-z}Zr_yGd_z](Ga_3)O_{12}$ Garnets," Jour. of Crystal Growth vol. 30 (1975) pp. 311-316.

Primary Examiner—Mark L. Bell
Assistant Examiner—C. M. Bonner
Attorney, Agent, or Firm—Norman N. Spain

[57] ABSTRACT

A method of growing mixed crystals having at least two lattice sites each having a different number of adjacent oxygen ions from melts of oxidic multi-component systems, homogeneous mixed crystals being grown such that the cations intended to occupy the first lattice site having the highest number of adjacent oxygen ions and to occupy the second lattice site having the next lowest number of adjacent oxygen ions are chosen such that the ratio of the bond length of the cations in the first lattice site to the bond length of the cations in the second lattice site is in the range from 0.7 to 1.5.

11 Claims, 7 Drawing Sheets

MIXED CRYSTALS OF DOPED RARE EARTH GALLIUM GARNET

This is a continuation of application Ser. No. 480,693, filed Feb. 14, 1992, now abandoned.

BACKGROUND OF THE INVENTION

The invention relates to a method of growing mixed crystals having at least two lattice sites with each a different number of adjacent oxygen ions from melts of oxidic multi-component systems and also to the use of the mixed crystals produced in accordance with this method.

In order to obtain homogeneous crystals, the requirement must be satisfied that the distribution coefficient of the cations $k_{eff(kat)}$, in such that the ratio of the concentration of the cations in the solidus phase to the concentration of the cations in the liquidus phase $C_s/C_l$ is at approximately 1. Crystals suitable for use in technical applications are obtained at low cation concentrations ($\leq 0.5$ formula units) still with distribution coefficients in the range from 0.90 to 1.20.

Crystals must here be understood to include both monocrystalline and polycrystalline material.

Garnet single crystals are, for example employed as substrates for the production of magnetic and magneto-optical layers. Examples in which such layers of materials are used are: magnetic bubble memories, displays and optical isolators. In addition, garnet single crystals can also be used as substrates for the epitaxial production of semiconductor layers.

A further field of application for garnets are laser crystals and detectors. In these examples garnets are utilized as host lattices for fluorescent ions. In addition to the production of compact laser crystals, garnet single crystals are also employed as substrates for the production of thin layers with laser properties.

Single-crystal layers can be deposited by, for example an epitaxial process, for example a liquid-phase epitaxial process, onto single-crystal substrates. A single-crystal growth of the layer with the necessary perfection can however only be effected when the substrate and the epitaxial layer have substantially the same crystallographical lattice constant. The lattice constant changes with respect to composition, that for each layer composition a substrate with a matched lattice constant is required.

By way of example, desired lattice constants for garnet substrates for the aforementioned applications are located within the range from 1.19 to 1.30 nm. This lattice constant range can not be covered entirely with the garnet compositions which have been known so far.

A solution therefore is the growth of mixed crystals in which the lattice constants across is adjusted the crystal composition. This does not only hold for garnets but in general for growing single-crystal layers on monocrystalline substrates. For technical uses also perowskites and spinels are of increasing significance.

These problems will be described in greater detail with reference to garnet compounds.

Garnet crystallizes with a cubic crystal structure. There are three different lattice sites, (dodecahedral, octahedral and tetrahedral sites) for the cations in the garnet lattice. Cations having the largest ion radii first occupy the dodecahedral site up to 3 formula units and have as their nearest neighbours 8 oxygen ions. Cations having the next but one smallest radii occupy the octahedral site and have 6 oxygen ions as their nearest neighbours, while the smallest cations occupy the tetrahedral site and are surrounded by 4 oxygen ions only. The lattice sites are interconnected contiguous to each other via their sides and their corners. The different lattice sites are characterized by the following types of brackets: dodecahedral site { }, octahedral site [ ], tetrahedral ( ).

Garnets can be described by the general formula $\{A^{3+}\}_3[B^{3+}]_2(C^{3+})_3O_{12}$, wherein A, B and C are cations having different radii. In garnets of a simple composition, such as, for example $\{Gd\}_3[Ga]_2(Ga)_3O_{12}$, the dodecahedral sites are occupied by $Gd^{3+}$-ions, the octahedral and tetrahedral sites by $Ga^{3+}$-ions.

A known method is to produce mixed crystals by mixing two garnets of a single composition (alternatively denoted terminal members). Thus, for example, mixed crystals of the composition $\{Gd,Sm\}_3[Ga]_2(Ga)_3O_{12}$ can be produced by mixing the two terminal members $\{Gd\}_3[Ga]_2(Ga)_3O_{12}$ and $\{Sm\}_3[Ga]_2(Ga)_3O_{12}$. In these mixed crystals the smaller $Gd^{3+}$-ions (r=0.1061 nm) are successively exchanged for the larger $Sm^{3+}$ ions (r=0.1087 nm) in the dodecahedral sites. The lattice constants of these mixed crystals increases linearly versus an increasing Sm content from 1.2382 nm up to 1.2438 nm.

Mixed crystals obtained by mixing terminal members have the disadvantage that there is a change in the concentration of the cations occupying the dodecahedral sites in the crystal from the beginning up to the crystal end; for the aforementioned examples this would be the Gd/Sm concentration.

A list for these inhomogeneities is the distribution coefficient of the cations $k_{eff(kat)}$. This is defined as the ratio of the cation concentration in the crystal to the cation concentration in the melt ($k_{eff(kat)}=C_s/C_l$). In the above example the distribution coefficient of gadolinium exceeds 1. This results in an enhancement of gadolinium in the crystal beginning and a corresponding decrease of the Gd concentration in the melt during the growing process in a lower proportion of gadolinium in the crystal end.

Because of the dependence of the lattice constant on the crystal composition the lattice constant increases from the crystal beginning up to the end.

Homogeneous mixed crystals, which are mixed crystals which have an approximately equal lattice constant across the overall length of the drawn crystal, can only be obtained when the distribution coefficient of the cations is approximately 1. Mixed crystals which are produced by mixing two terminal members have however distribution coefficients which deviate relatively large from 1. Because of the resultant poor crystal quality and the change in the lattice constant in the longitudinal direction of the crystal, mixed crystals produced by mixing two terminal members are generally not suitable for use for technical applications. A solution might be the use of multi-component systems which, because of the higher number of cations, provide a greater number of possibilities to optimize the distribution coefficient across the compound. How to achieve this is however not known yet.

SUMMARY OF THE INVENTION

The invention has for its object to provide a method by means of which compounds of oxidic multicomponent systems can be found which are suitable for the production of mixed crystals having distribution coefficients which are approximately 1.

According to the invention, this object is accomplished in that homogeneous crystals are grown in such a manner that the cations intended to occupy the first lattice sites having the highest number of adjacent oxygen ions and the cations intended to occupy the second lattice sites having the next lower number of adjacent oxygen ions are selected such that the ratio of the bond length of the cations in the first lattice site to the bond length of the cations in the second lattice site is in the range from 0.7 to 1.5.

FIG. 1 is a graph showing the ratio of the bond length of the dodecahedral site {A(1)-0} to the bond length of the octahedral site [B-0] for mixed crystals having a composition as defined by the general formula

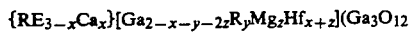
$$\{RE_{3-x}Ca_x\}[Ga_{2-x-y-2z}R_yMg_zHf_{x+z}](Ga_3O_{12})$$

wherein $0 \leq x \leq 0.55$ $0.01 \leq y \leq 0.28$ $0 \leq z \leq 0.55$ $0.15 \leq x+z \leq 0.60$ with $RE = Gd^{3+}$, $Tb^{3+}$, $Dy^{3+}$, $Y^{3+}$, $Er^{3+}$ and $R = In$ and/or $RE$.

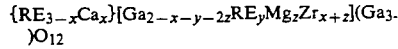
$$\{RE_{3-x}Ca_x\}[Ga_{2-x-y-2z}RE_yMg_zZr_{x+z}](Ga_3)O_{12}$$

wherein $0 \leq x \leq 0.58$ $0 \leq y \leq 0.10$ $0 \leq z \leq 0.50$ $0.15 \leq x+z \leq 0.68$ and wherein $RE = Sm^{3+}$, $Eu^{3+}$, $Gd^{3+}$, $Tb^{3+}$.

Figure 3:
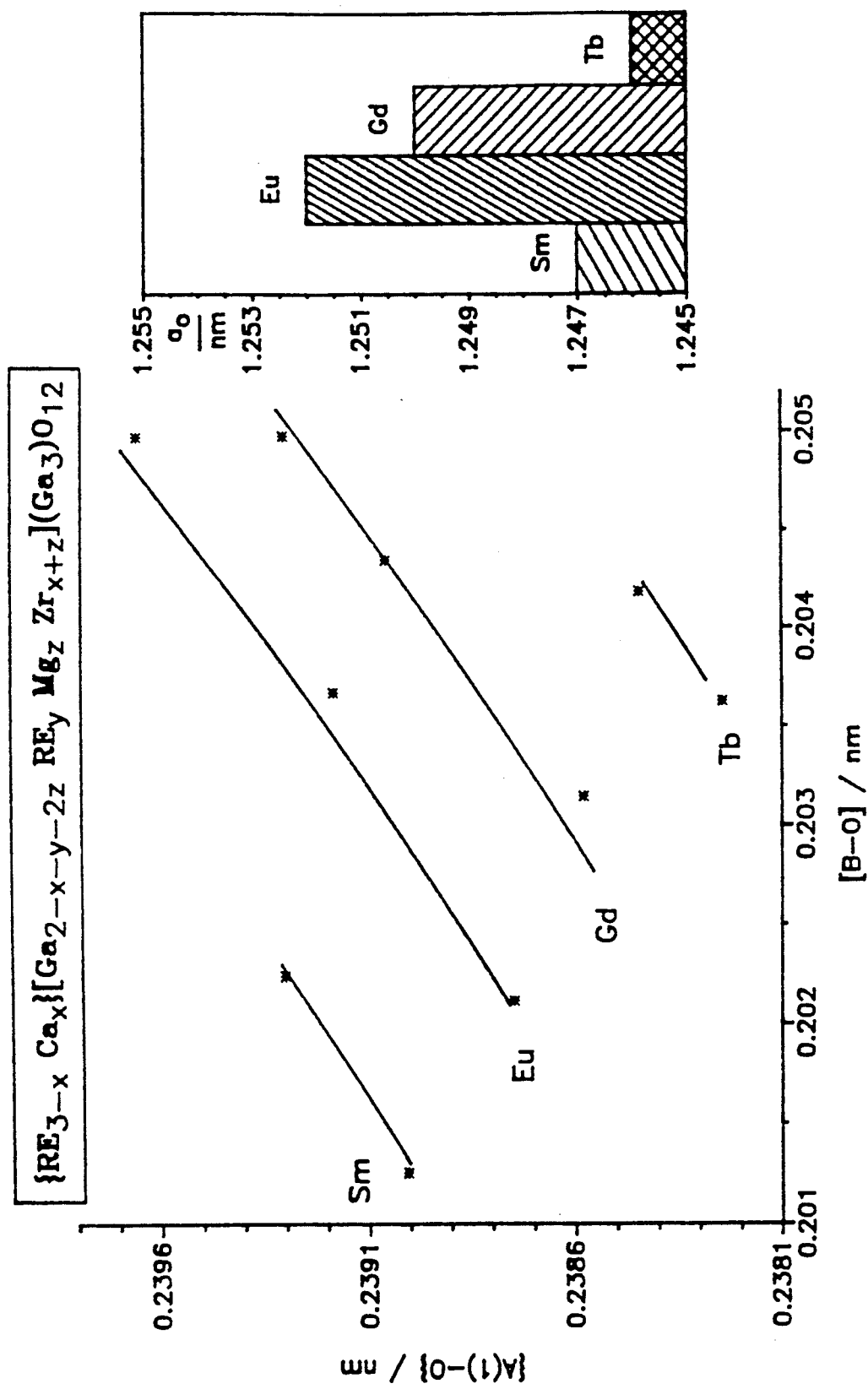
FIG. 3 is a graph showing the ratio of the bond length of the dodecahedral site {A(1)-0} to the bond length of the octahedral site [B-0] for mixed crystals defined by the general composition
Figure 4:
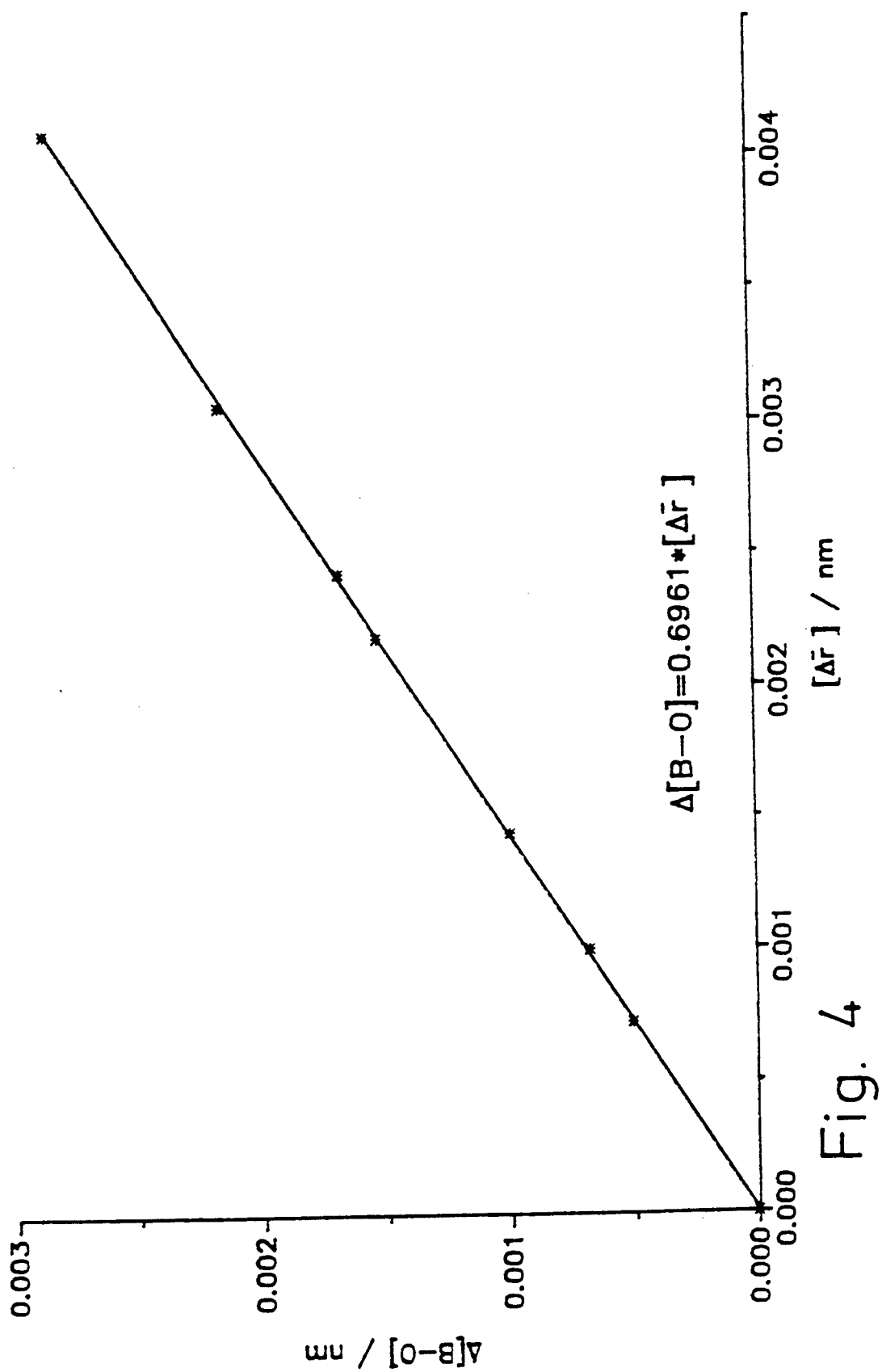

FIG. 4 is a graph showing the change in the bond length of the octahedral site $\Delta[B-0]$ versus the change of the average radius of the cations in the octahedral site $[\Delta \bar{r}]$ for the mixed crystal compositions in accordance with FIG. 3.

Figure 1:
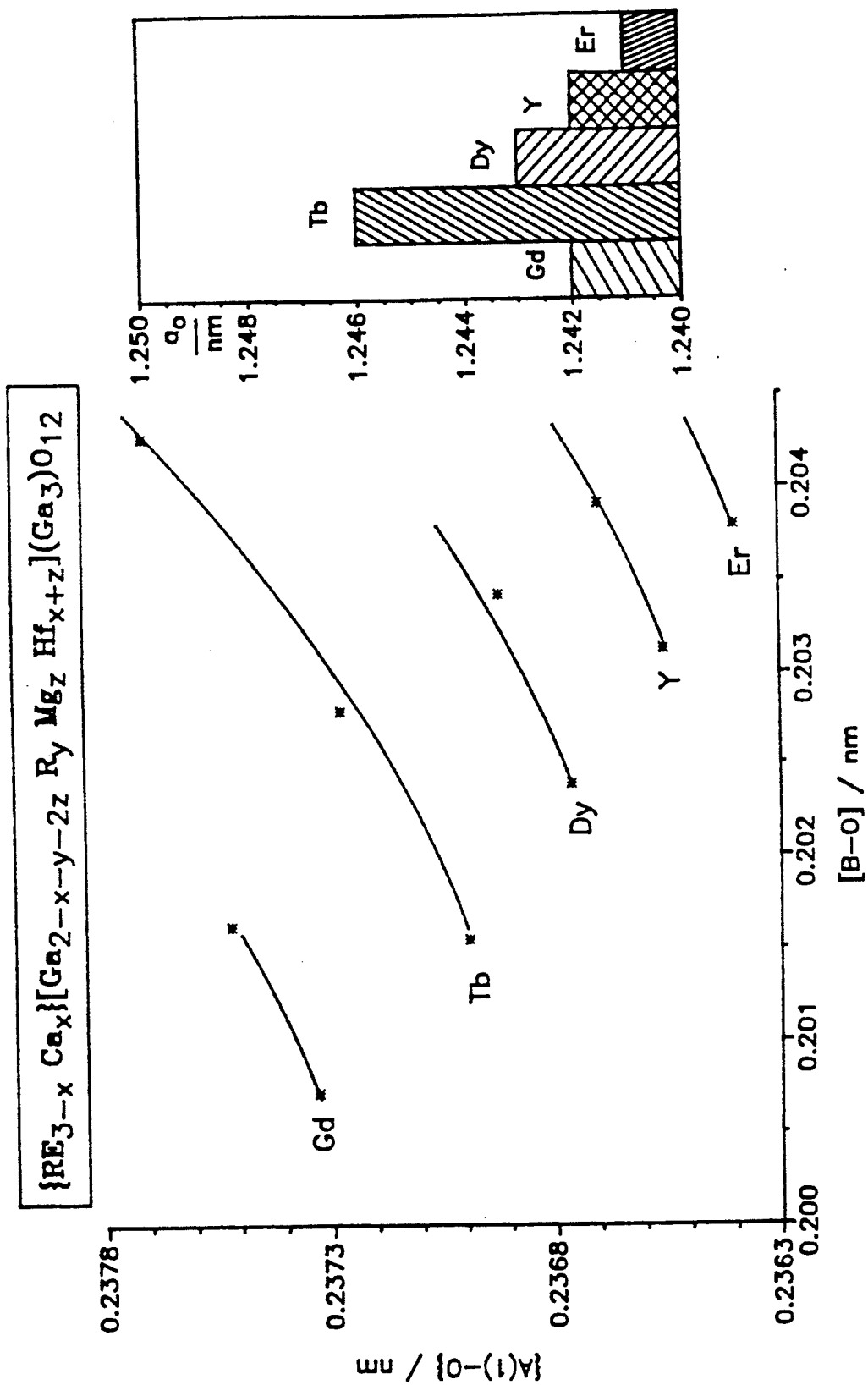
Figure 2:
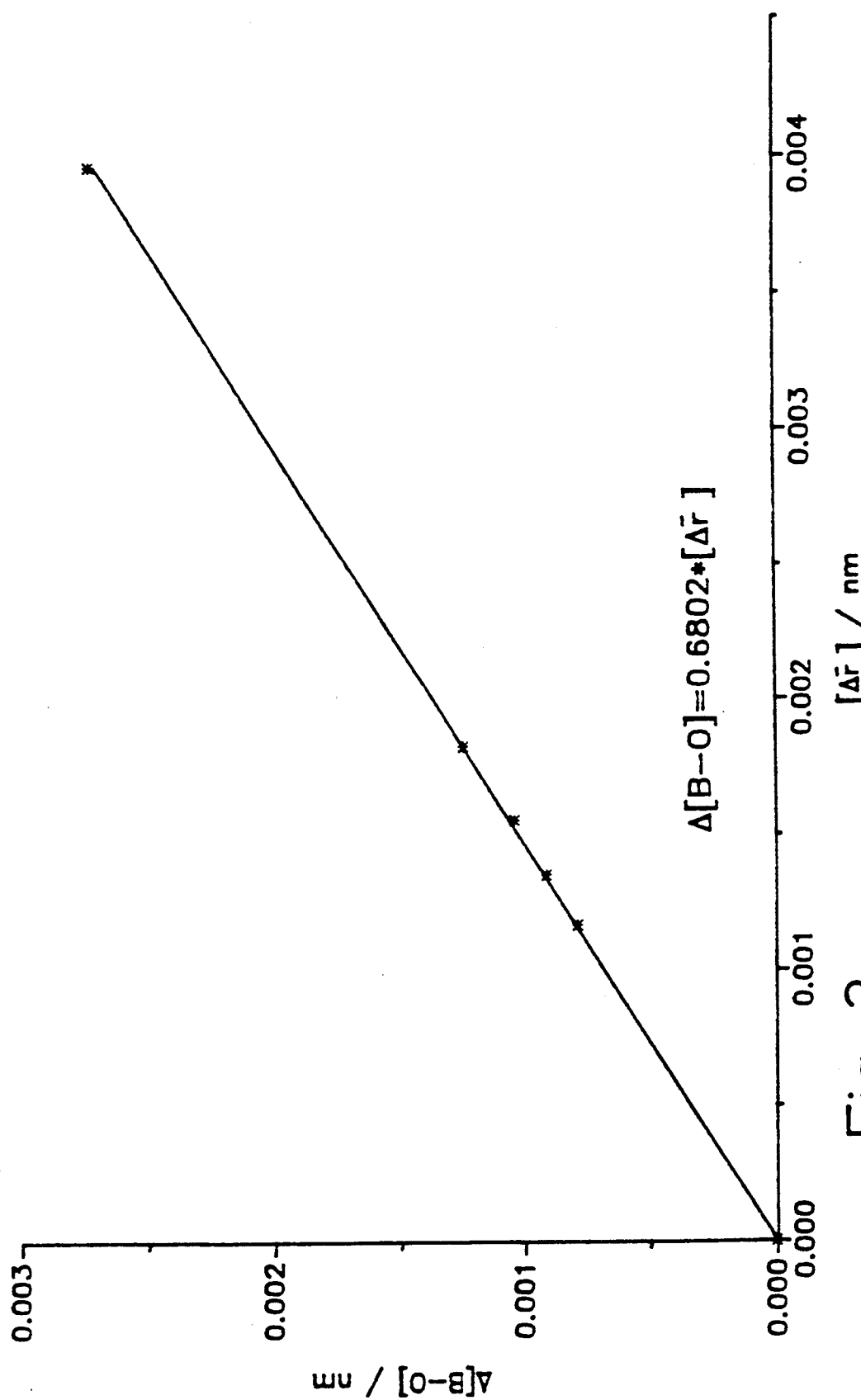
FIG. 2 is a graph showing the change in bond length of the octahedral sites $\Delta[B-0]$ versus the change in the average radius of the cations in the octahedral site $[\Delta \bar{r}]$ for the mixed crystal compounds shown in FIG. 1.
Figure 5:
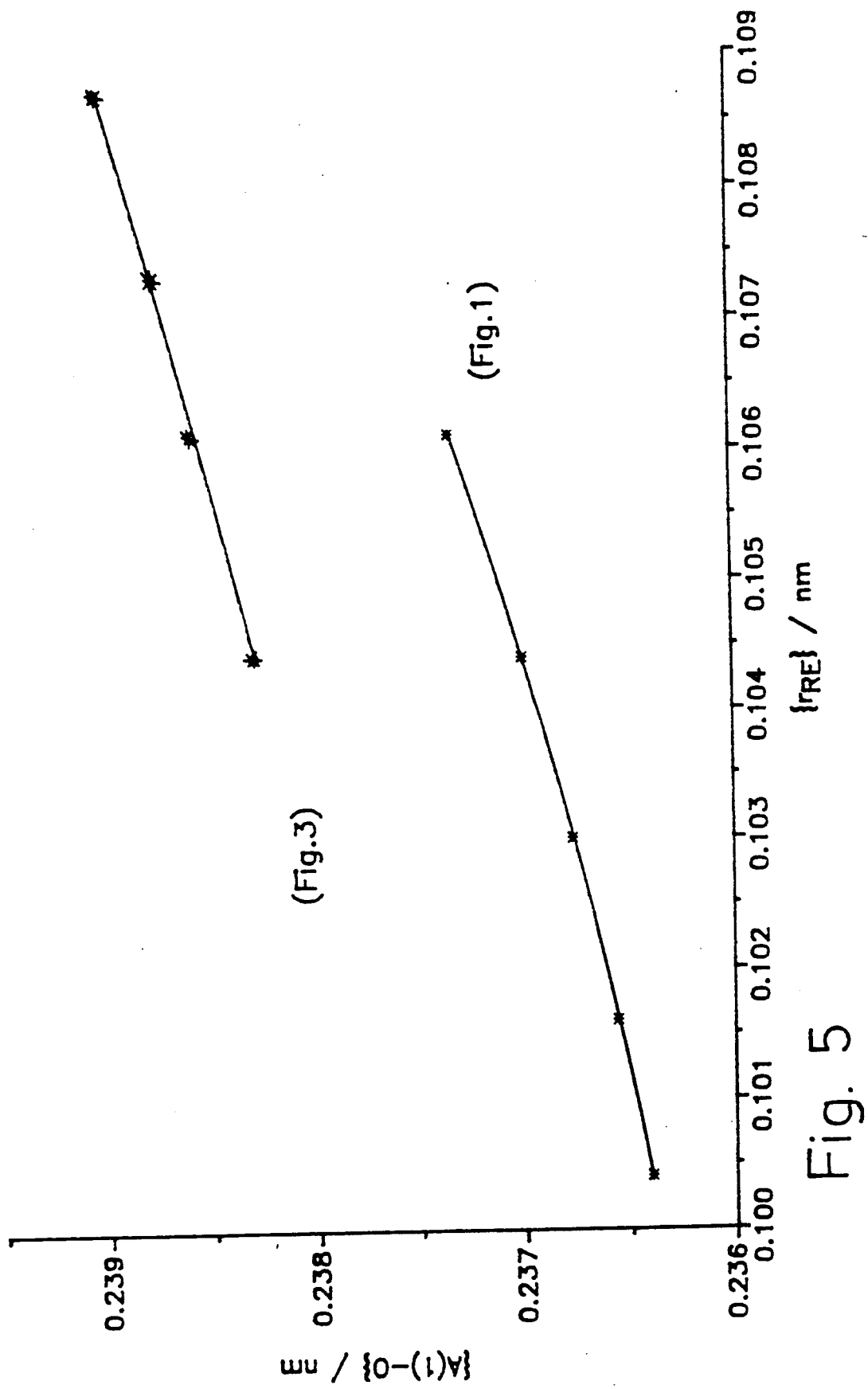

FIG. 5 is a graph showing the dependence of the bond length of the dodecahedral site {A(1)-0} on the radius of the rare earth metal ions in the dodecahedral site $\{r_{RE}\}$ for the mixed crystal compositions in accordance with FIG. 1 and FIG. 3.

Figure 6:
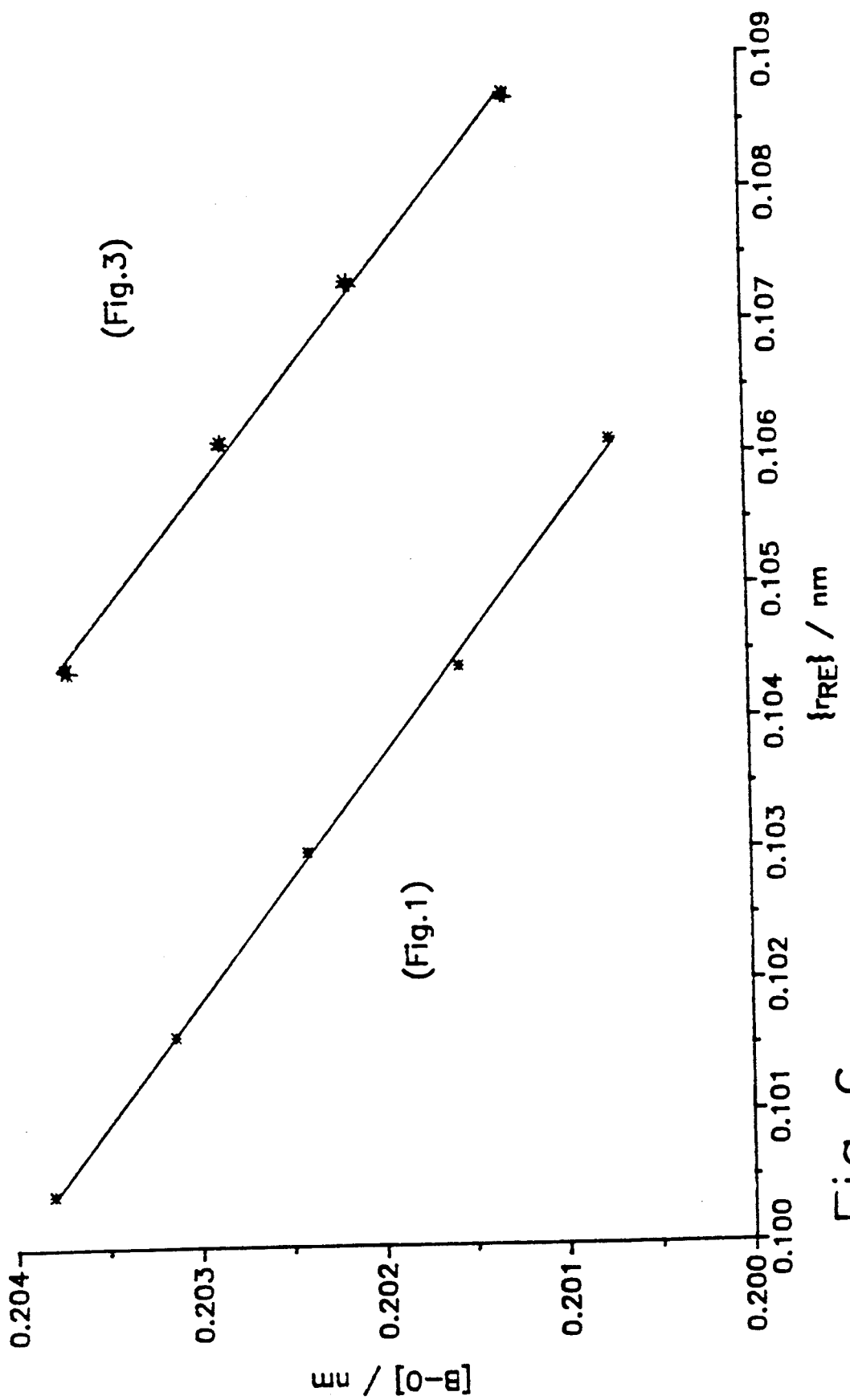

FIG. 6 is a graph showing the dependence of the bond length of the octahedral site [B-0] on the radius of the rare earth metal ions in the dodecahedral site $\{r_{RE}\}$ for the mixed crystal compositions in accordance with FIG. 1 and FIG. 3.

Figure 7:
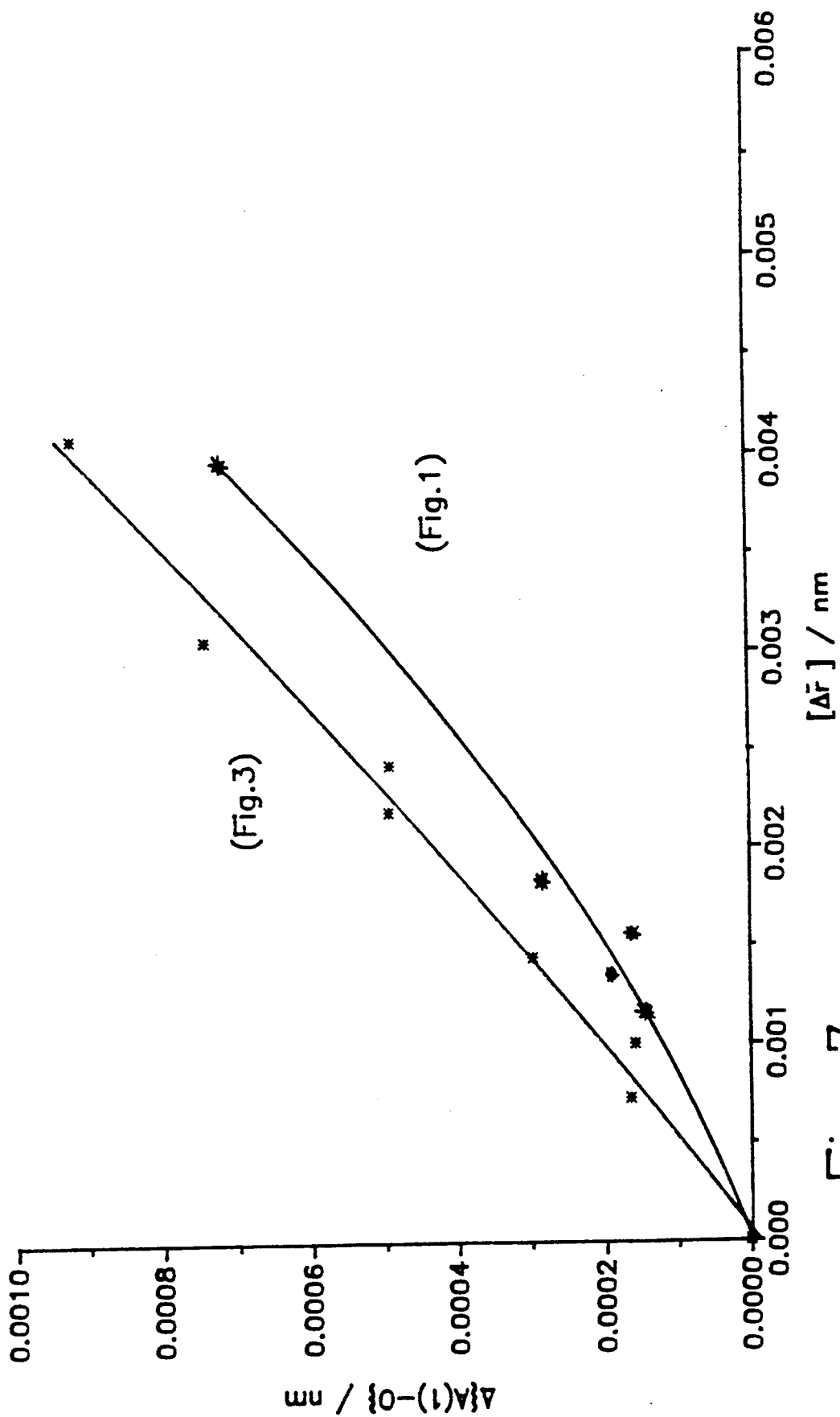

FIG. 7 is a graph showing the change in the bond length of the dodecahedral site {A(1)-0} versus the change in the average radius of the cations in the octahedral site $[\Delta \bar{r}]$ for the mixed crystal compositions in accordance with FIG. 1 and FIG. 3.

DETAILED DESCRIPTION OF THE INVENTION

The cations present in the first lattice site preferably are members of group consisting of $K^{1+}$, $Ba^{2+}$, $Pb^{2+}$, $Sr^{2+}$, $La^{3+}$, $Na^{1+}$, $Ce^{3+}$, $Pr^{3+}$, $Bi^{3+}$, $Ca^{2+}$, $Nd^{3+}$, $Cd^{2+}$, $Th^{4+}$, $Sm^{3+}$, $Eu^{3+}$, $Gd^{3+}$, $Tb^{3+}$, $Dy^{3+}$, $Ho^{3+}$, $Y^{3+}$, $Er^{3+}$, $Tm^{3+}$, $Yb^{3+}$, $Lu^{3+}$, $Ce^{4+}$, $Mn^{2+}$, $Cu^{2+}$, $In^{3+}$, $Li^{1+}$, $Fe^{2+}$, $Zn^{2+}$, $Co^{2+}$, $Mg^{2+}$, $Sc^{3+}$, $Sn^{4+}$, $Ti^{4+}$ and $Ni^{2+}$.

The cations present in the second lattice group preferably are members of the group consisting of $Sm^{3+}$, $Eu^{3+}$, $Gd^{3+}$, $Tb^{3+}$, $Dy^{3+}$, $Ho^{3+}$, $Y^{3+}$, $Er^{3+}$, $Tm^{3+}$, $Yb^{3+}$, $Lu^{3+}$, $Mn^{2+}$, $In^{3+}$, $Fe^{2+}$, $Pb^{4+}$, $Li^{1+}$, $Sc^{3+}$, $Zr^{4+}$, $Co^{2+}$, $Zn^{2+}$, $Cu^{2+}$, $Mg^{2+}$, $Hf^{4+}$, $Sn^{4+}$, $Ni^{2+}$, $Rh^{3+}$, $Mn^{3+}$, $Fe^{3+}$, $V^{3+}$, $Ta^{5+}$, $Nb^{5+}$, $Pt^{4+}$, $Ru^{4+}$, $Cr^{3+}$, $Ga^{3+}$, $Co^{3+}$, $Ti^{4+}$, $Ni^{3+}$, $Cu^{3+}$, $Al^{3+}$, $Mn^{4+}$ and $Ga^{4+}$.

In accordance with an advantageous further development of the method in accordance with the invention, for growing mixed crystals on the basis of rare earth metal-gallium-garnet, the composition of the components forming the melt is selected such in dependence on the bond length of the dodecahedral site {A(1)-0} and of the octahedral site [B-0] that the bond length of the dodecahedral site {A(1)-0} is in the range from 0.2361 nm to 0.2453 nm and the bond length of the octahedral site [B-0] is in the range from 0.2008 nm to 0.2108 nm.

In accordance with a still further advantageous embodiment of the method of the invention mixed crystals are grown which have a composition defined by the general formula

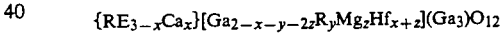
$$\{RE_{3-x}Ca_x\}[Ga_{2-x-y-2z}R_yMg_zHf_{x+z}](Ga_3)O_{12}$$

wherein $RE = $ a cation from the group $Gd^{3+}$, $Tb^{3+}$, $Dy^{3+}$, $Ho^{3+}$, $Y^{3+}$, $Er^{3+}$ $R = In$ and/or $RE$ and $0 \leq x \leq 0.55$ $0.01 \leq y \leq 0.28$ $0 \leq z \leq 0.55$ $0.15 \leq x+z \leq 0.60$ In accordance with a further advantageous embodiment of the method of the invention, mixed crystals are grown which have a composition defined by the general formula

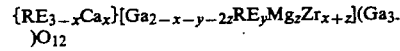
$$\{RE_{3-x}Ca_x\}[Ga_{2-x-y-2z}RE_yMg_zZr_{x+z}](Ga_3)O_{12}$$

wherein $RE = $ a cation from the group $Sm^{3+}$, $Eu^{3+}$, $Gd^{3+}$, $Tb^{3+}$, and $0 \leq x \leq 0.58$ $0 \leq y \leq 0.10$ $0 \leq z \leq 0.50$ $0.15 \leq x+z \leq 0.68$ In accordance with further advantageous embodiments of the method in accordance with the invention there is calculated for the initial members of the mixed crystal series of the system defined by the general formula $$\{RE_{3-x}Ca_x\}[Ga_{2-x-y-2z}R_yMg_zHf_{x+z}](Ga_3)O_{12}$$

the bond length of the dodecahedral site with $$\{A(1)\text{-}O\} = 0.30362 - 1.4571 \cdot \{r_{RE}\} + 7.8443 \cdot \{r_{RE}\}^2$$

(in nanometers) and the bond length of the octahedral site with $$[B\text{-}O] = 0.25836 - 0.5436 \cdot \{r_{RE}\} \text{ (in Nanometers)},$$

wherein $\{r_{RE}\}$ is the radius of the rare earth metal ion in the dodecahedral site. The increase in the bond lengths of always the dodecahedral site $\Delta\{A(1)\text{-}O\}$ and of the octahedral site $\Delta[B\text{-}O]$ of the systems of the mixed crystal series is calculated (in nanometer) with $$\Delta\{A(1)\text{-}O\} = 0.1024 \cdot [\Delta \bar{r}] + 19.8482 \cdot [\Delta \bar{r}]^2 \text{ and}$$

$$\Delta[B\text{-}O] = 0.6802 \cdot [\Delta \bar{r}].$$

In accordance with further advantageous embodiments of the method of the invention there are calculated for the initial members of the mixed crystal series of the systems defined by the general formula $$\{RE_{3-x}Ca_x\}[Ga_{2-x-y-2z}RE_yMg_zZr_{x+z}](Ga_3)O_{12}$$

the bond length of the dodecahedral site with $$\{A(1)\text{-}O\} = 0.25119 - 0.4027 \cdot \{r_{RE} + 2.6730 \cdot \{r_{RE}\}^2$$

(in nanometers) and the bond length of the octahedral site with $$[B\text{-}O] = 0.26266 - 0.5645 \cdot \{r_{RE}\} \text{ (in nanometers)}$$

wherein $\{r_{RE}\}$ is the radius of the rare earth metal ions in the dodecahedral sites. The increase in the bond length of the dodecahedral site $\Delta\{A(1)\text{-}O\}$ and of the octahedral $\Delta[B\text{-}O]$ of the mixed crystal series system is calculated using $$\Delta\{A(1)\text{-}O\} = 0.2070 \cdot [\Delta \bar{r}] + 6.0593 \cdot [\Delta \bar{r}]^2 \text{ (in nanometers) and}$$

$$\Delta[B\text{-}O] = 0.6961 \cdot [\Delta \bar{r}] \text{ (in nanometers.}$$

Using the above-defined formulae for the calculation of the bond lengths of always the dodecahedral site $\{A(1)\text{-}O\}$ and of the octahedral site $[B\text{-}O]$ and their increases $\Delta\{A(1)\text{-}O\}$ and $\Delta[B\text{-}O]$, it is possible to determine selectively all the compounds within the above-defined systems, having the distribution coefficients $k_{eff(kat)}$ near 1.

A person skilled in the art can empirically determine corresponding formulae for desired mixed crystal series of different compositions on the basis of the radii of the cations occupying the first and second lattice sites, in dependence on their distance to the adjacent oxygen.

These data can be obtained from the structure of the desired compositions.

In accordance with a further advantageous embodiment of the method in accordance with the invention mixed crystals are grown with a composition defined by the general formula $$RE_{1-x}Sr_xGa_{1-y}Zr_yO_3, \text{ wherein}$$

RE = a cation from the group $La^{3+}$, $Pr^{3+}$, $Nd^{3+}$ and $0.05 \leq x \leq 0.10$ $0.05 \leq y \leq 0.10$ Preferably, a mixed crystal is grown having a melt composition defined by the formula $$La_{0.95}Sr_{0.05}Ga_{0.95}Zr_{0.05}O_3.$$

This mixed crystal has orthorhombic perowskite structures wherein the first lattice site occupied by $La^{3+}$ and $Sr^{2+}$ is surrounded by 8 adjacent oxygen ions and the second lattice site occupied by $Ga^{3+}$ and $Zr^{4+}$ is surrounded by 6 adjacent oxygen ions.

The crystal composition of this mixed crystal is defined by the formula $$La_{0.95}Sr_{0.05}Ga_{0.95}Zr_{0.04}O_3.$$

wherein the distribution coefficients are for $La^{3+} = 1.00$, for $Sr^{2+} = 1.00$, for $Ga^{3+} = 1.01$ and for $Zr^{4+} = 0.80$.

The mixed crystals produced in accordance with the method of the invention can advantageously be used for the production of monocrystalline layers on substrates, the lattice constant of the layer to be deposited can be adapted as regards its composition within relatively wide limits to the lattice constants of the substrate. Monocrystalline layers are, for example, epitaxial layers which are produced in accordance with known methods, such as for example liquid-phase epitaxy or vapour-phase epitaxy or by means of a cathode sputtering procedure with subsequent annealing. Monomolecular epitaxial layers can be produced by atomic layer epitaxy. The mixed crystals produced in the method of the invention can also advantageously be used for producing multilayer structures applied on a substrate, these layers consisting of different monocrystalline layers having a thickness from always $>100 \times a$ or $<100 \times a$, a being the lattice constant of the material of each layer.

It is, for example, possible to form superstructures using multilayer structures of different monocrystalline layers having a thickness of always $>100 \times a$; superstructures are multilayer structures comprising single layers having different properties.

It is, for example, possible to form superlattices using multilayer structures of different monocrystalline layers having a thickness of $<100 \times a$ always. Superlattices are multilayer structures comprising single layers of very small layer thicknesses (greater than monomolecular) in which the intrinsic properties of the bulk material of a corresponding composition, so a single crystal of larger dimensions ($>100 \times a$), have not yet been formed.

The invention is based on the following recognition: When the bond strengths for the cations to be substituted (cations of the host lattice) correspond to approximately the bond strength of the cations to be built into the host lattice (substituents), the distribution coefficient $k_{eff(kat)} = C_s/C_l$ must be near 1. This hypothesis has been verified.

A measure of the bond strengths of the cation in the crystal lattice is their distance to the neighbouring oxygen ions. This distance is designated the bond length. The average bond lengths for garnets can be calculated as described by Hawthorne (J. Solid State Chemistry, 37 (1981), pages 157 to 164) and Basso (Neues Jahrbuch der Mineralogie, Vol. 3, (1985), pages 108-114). The lattice parameters x, y and z of the oxygen ions are first determined on the basis of the equations (1) to (3):

$$x = 0.0278 \{\overline{r}\} + 0.0123 \,[\overline{r}] - 0.0482 \,(\overline{r}) + 0.0141 \quad (1)$$

$$y = -0.0237 \{\overline{r}\} + 0.0200 \,[\overline{r}] - 0.0321 \,(\overline{r}) + 0.0523 \quad (2)$$

$$z = -0.0102 \{\overline{r}\} + 0.0305 \,[\overline{r}] - 0.0217 \,(\overline{r}) + 0.6519 \quad (3)$$

wherein r is the average radius of all the cations in the different lattice sites.

The average bond lengths are obtained from the following equations (4) to (7):

$$\{A(1)\text{-}O\}^2 = a_0^2[(x+\tfrac{1}{8})^2 + y^2 + (z-\tfrac{1}{8})^2] \quad (4)$$

$$\{A(2)\text{-}O\}^2 = a_0^2[x^2 + (y-\tfrac{1}{4})^2 + (z-5/8)^2] \quad (5)$$

$$[B\text{-}O]^2 = a_0^2[x^2 + y^2 + (z-\tfrac{1}{4})^2] \quad (6)$$

$$(C\text{-}O)^2 = a_0^2[x-\tfrac{1}{8})^2 + y^2(z-\tfrac{1}{4})^2]. \quad (7)$$

For the equations (4) and (5) it should be noted that for the dodecahedral site, because of its deformation, (distorted hexahedron), two average bond lengths $\{A(1)\text{-}O\}$ and $\{A(2)\text{-}O\}$ are obtained. For the calculations on the basis of the method in accordance with the present invention only the bond length in accordance with $\{A(1)\text{-}O\}$ is taken into account.

Using the equations (1) to (7) in accordance with Hawthorne and Basso, it is not possible to determine selectively only those compounds having distribution coefficients $k_{eff(kat)}$ of 1 or near 1. Using these known equations, compounds are obtained having all the possible distribution coefficients from $k_{eff(kat)} \ll 1$ to $k_{eff(kat)} \gg 1$.

In order to produce, within the scope of the present method, garnet mixed crystals having distribution coefficients near 1 from melts of oxidic multicomponent systems, the coupled substitution method is utilised.

In the garnet lattice there are three possibilities for a coupled substitution.

1. Coupled substitution in a lattice site (octocahedron), for example $[2B^{3+}] \to [D^{2+}] + [E^{4+}]$ For D it is, for example possible to utilise the cations $Ni^{2+}$, $Mg^{2+}$, $Cu^{2+}$, $Co^{2+}$, $Mn^{2+}$ and for E the cations $Sn^{4+}$, $Hf^{4+}$, $Zr^{4+}$. Such mixed crystals can be defined by the general formula $\{A_3^{3+}\}[B_{2-2x}^{3+} D_x^{2+} E_x^{4+}](C_3^{3+})O_{12}$ because of the charge equalisation $D_x = E_x$.

2. Coupled substitution in different lattice sites (dodecahedron site and octahedral site) for example:

$$\{A^{3+}\} + [B^{3+}] \to \{F^{2+}\} + [E^{4+}]$$

defined by the general formulae for the mixed crystals:
$$\{A_{3-y}^{3+} F_y^{2+}\}[B_{2-x}^{3+} E_x^{4+}](C_3^{3+})O_{12} \quad (2.1)$$

$$\{A_{3-y}^{3+} F_y^{2+}\}[B_{2-y-2x}^{3+} D_x^{2+} E_{x+y}^{4+}](C_3^{3+})O_{12} \quad (2.2)$$

In the general formula (2.1) only one cation is always used as a substituent in the dodecahedral and the octahedral sites, whilst in the formula (2.2) a further, bivalent host ion is used in the octahedral site. For F it is possible to choose, for example the cations $Mg^{2+}$, $Ca^{2+}$, $Sr^{2+}$, $Mn^{2+}$ and $Th^{4+}$.

3. Coupled substitution in three different lattice sites (dodecahedron site, octahedral site, tetrahedral site) for example:

$$\{A^{3+}\} + [B^{3+}] + (2C^{3+}) \to \{F^{2+}\} + [D^{2+}] + (2G^{4+})$$

defined by the general formula for the mixed crystals:

$$\{A_{3-x}^{3+} F_x^{2+}\}[B_{2-y}^{3+} D_y^{2+}](C_{3-x-y}^{3+} G_{x+y}^{4+})O_{12}$$

Also in this example it is possible to use a plurality of cations as substituents in different lattice sites. For G it is, for example, possible to use $Ge^{4+}$, $Sn^{4+}$ or $Ti^{4+}$ as the cation.

Hereinafter embodiments of the invention will now be described and their mode of operation will be explained with reference to the accompanying Figures.

For the production of mixed crystals rare earth metal gallium-garnets are used as a host lattice for the substituents. Suitable substituents, because of their radius, are, for example, the cations $Gd^{3+}$, $Tb^{3+}$, $Dy^{3+}$, $Y^{3+}$, $Er^{3+}$; advantageously, also bivalent and tetravalent cations having suitable radii can be chosen for the coupled substitution.

To produce melting specimens the oxides of the selected garnet compositions are mixed and melted in an iridium crucible in a weakly oxidizing atmosphere. Subsequent thereto, an iridium rod is immersed in the melt and the temperature of the melt is reduced to such a level that crystallisation occurs around the iridium rod. The crystal formed around the rod is sucked upwardly at a rate of 5 mm/h from the melt surface. The growing procedure is interrupted when half the starting melt has crystallized. After cooling to ambient temperature the crystal is examined by means of X-ray analysis for phase purity and the lattice constant of the crystal is measured. The lattice constant can be calculated also from the melt composition in accordance with the equation by Strocka et al published in Philips Journal of Research 33 (1978) pages 186 to 202.

A comparison between the calculated and measured lattice constant gives a first impression of the distribution coefficients of the cations. If both lattice constants are located in the range between error boundaries from $\Delta a_o = \pm 1.10^{-3}$ nm, distribution coefficients of near 1 can be expected. For an accurate determination of the distribution coefficient, single crystals are grown from melt compositions and their crystal composition is investigated.

With the object of growing single crystals, the oxides of the desired composition are mixed, pressed in the shape of a cylinder and sintered at 1500° C. in an oxygen atmosphere.

For a single crystal of, for example, the composition $Gd_3Ga_{1.59}Gd_{0.01}Mg_{0.2}Hf_{0.2}Ga_3O_{12}$ a mixture is made of 106.36 g $Gd_2O_3$; 83.86 g $Ga_2O_3$; 1.57 g MgO and 8.21 g $HfO_2$ (total starting weight 200 g) and formed into a sintered body described in the manner described. The sintered body is subsequently melted in an iridium crucible having a diameter of 40 mm and a height of 40 mm at a temperature of approximately 1700° C. in a closed crystal drawing apparatus. A gas mixture consisting of 50% $N_2$ + 50% $CO_2$ is passed through the apparatus. A cylindrical single crystal rod whose crystallographic [111]-direction extends parallel to the rod axis, is used as a seed crystal. The seed crystal is first immersed in the melt (initial injection) and is consequently drawn upwardly from the melt surface at a rate of 5 mm/h. The growing crystal is rotated around its axis in a period of 20 $min^{-1}$. The growing procedure is controlled by weighing in such a manner that the crystal first grows conically in the direction of its width, until the desired crystal diameter of 20 mm has been obtained. Subsequently, the generator power is adjusted such that the crystal continues growing with a constant diameter. The growing procedure is ended by rapidly drawing the grown crystal from the residual melt. Subsequent thereto the crystal is slowly cooled to ambient temperature.

To determine the crystal compositions and the lattice constants wafers are cut from the beginning and the end of the crystal, X-ray fluorescent analysis being used to determine the crystal composition (error of the analysis: ±0.02 formula units).

The distribution coefficients of the cations are obtained from the compositions of the beginning and end of the crystal ($C_s$) and the melt ($C_l$) in accordance with the equation $k_{eff(kat)} = C_s/C_l$.

Hereafter the production of mixed crystals from mixed crystal groups (I to III) having several mixed crystal systems will be described.

Mixed crystal group I having a composition as defined by the general formula $$\{RE_{3-x}Ca_x\}[Ga_{2-x-y-2z}R_yMg_zHf_{x+z}](Ga_3)O_{12}$$

wherein $$RE = Gd^{3+}, Tb^{3+}, Dy^{3+}, Y^{3+}, Er^{3+},$$

wherein

R = In and/or RE and wherein $0 \leq x \leq 0.55$ $0.01 \leq y \leq 0.28$ $0 \leq z \leq 0.55$ $0.15 \leq x + z \leq 0.60$ The bond lengths {A(1)-0} and [B-0] of the dodecahedral and octahedral sites are used as parameters for the description of the five mixed crystal systems of the mixed crystal group I. The bond lengths are calculated with the aid of the equations (8) to (11) given in the sequel of the description. Inversely, also the garnet compositions can again be calculated from the bond lengths.

The average bond lengths of calculated garnet compositions having distribution coefficients near 1 are represented by the curves in the diagram of FIG. 1. An * in FIG. 1 defines the average bond lengths of grown crystals. This also holds for the diagrams shown in FIGS. 2 to 7. For all the initial members of the mixed crystal series (start of the curves) the values for the bond lengths increase with leaps and bounds versus increasing radii of the rare earth metals. Each curve in FIG. 1 is associated with a given mixed crystal system of the mixed crystal group I; the mixed crystal systems have the following compositions:

1. $\{Gd_{3-x}Ca_x\}[Ga_{2-x-y-2z}Gd_yMg_zHf_{x+z}](Ga_3)O_{12}$ (Gd-curve FIG. 1)

The initial member of the mixed crystal series is defined by the formula:

$$\{Gd_{2.85}Ca_{0.15}\}[Ga_{1.83}Gd_{0.02}Hf_{0.15}](Ga_3)O_{12}$$

wherein the bond lengths for the dodecahedral site and for the octahedral site amount to:

$$\{A(1)\text{-}0\} = 0.2374 \text{ nm}, [B\text{-}0] = 0.2008 \text{ nm}.$$

The terminal member of the mixed crystal series is defined by the formula:

$$\{Gd_{3.00}\}[Ga_{1.59}Gd_{0.01}Mg_{0.20}Hf_{0.20}](Ga_3)O_{12}$$

wherein the bond lengths for the dodecahedral site and for the octahedral site amount to:

$$\{A(1)\text{-}0\} = 0.2375 \text{ nm}, [B\text{-}0] = 0.2016 \text{ nm}$$

The mixed crystal compositions are located in the following range:

$0 \leq Ca \leq 0.15; 0 \leq Mg \leq 0.20; 0.15 \leq Hf \leq 0.20$ and $0.01 \leq [Gd] \leq 0.02.$ The melt composition of each initial and terminal member is specified. This also holds for all the following embodiments.

2. $\{Tb_{3-x}Ca_x\}[Ga_{2-x-y-2z}Tb_xMg_zHf_{x+z}](Ga_3)O_{12}$ (Tb-curve FIG. 1)

The initial member of the mixed crystal series is defined by the formula $$\{Tb_{2.65}Ca_{0.35}\}[Ga_{1.62}Tb_{0.03}Hf_{0.35}](Ga_3)O_{12}$$

wherein the bond lengths for the dodecahedral site and for the octahedral site amount to:

$$\{A(1)\text{-}0\} = 0.02370 \text{ nm}, [B\text{-}0] = 0.2015 \text{ nm}.$$

The terminal member of the mixed crystal series is defined by the formula $$\{Tb_{2.95}Ca_{0.05}\}[Ga_{0.83}Tb_{0.02}Mg_{0.55}Hf_{0.60}](Ga_3)O_{12}$$

wherein the bond lengths for the dodecahedral site and for the octahedral site amount to:

$$\{A(1)\text{-}0\} = 0.2377 \text{ nm}, [B\text{-}0] = 0.2043 \text{ nm}.$$

The mixed crystal compositions are located in the following range:

$0.25 \leq Ca \leq 0.38; 0 \leq Mg \leq 0.35; 0.38 \leq Hf \leq 0.60$ and $0.05 \leq [Dy] \leq 0.11$ 3. $\{Dy_{3-x}Ca_x\}[Ga_{2-x-y-2z}Dy_yMg_zHf_{x+z}](Ga_3)O_{12}$ (Dy-curve FIG. 1)

The initial member of the mixed crystal series is defined by the formula:

$\{Dy_{2.62}Ca_{0.38}\}[Ga_{1.51}Dy_{0.11}Hf_{0.38}](Ga_3)O_{12}$ wherein the bond lengths for the dodecahedral site and for the octahedral site amount to:

$\{A(1)\text{-}O\} = 0.2367$ nm, $[B\text{-}O] = 0.2022$ nm.

The terminal member of the mixed crystal series is defined by the formula:

$\{Dy_{2.75}Ca_{0.25}\}[Ga_{1.00}Dy_{0.05}Mg_{0.35}Hf_{0.60}](Ga_3)O_{12}$, wherein the bond lengths for the dodecahedral site and for the octahedral site amount to:

$\{A(1)\text{-}O\} = 0.2370$ nm, $[B\text{-}O] = 0.2036$ nm.

The mixed crystal compositions are located in the following range:

$0.25 \leq Ca \leq 0.38$; $0 \leq Mg \leq 0.35$; $0.38 \leq Hf \leq 0.60$ and $0.05 \leq [Dy] \leq 0.11$ 4. $\{Y_{3-x}Ca_x\}[Ga_{2-x-y-2z}Y_yMg_zHf_{x+z}](Ga_3)O_{12}$ (Y-curve FIG. 1).

The initial member of the mixed crystal series defined by the formula:

$\{Y_{2.51}Ca_{0.49}\}[Ga_{1.33}Y_{0.18}Hf_{0.49}](Ga_3)O_{12}$, wherein the bond lengths for the dodecahedral site and for the octahedral site amount to:

$\{A(1)\text{-}O\} = 0.2366$ nm, $[B\text{-}O] = 0.2031$ nm.

The terminal member of the mixed crystal series is defined by the formula:

$\{Y_{2.60}Ca_{0.40}\}[Ga_{1.01}Y_{0.19}Mg_{0.20}Hf_{0.60}](Ga_3)O_{12}$ wherein the bond lengths for the dodecahedral site and for the octahedral site amount to:

$\{A(1)\text{-}O\} = 0.2369$ nm, $[B\text{-}O] = 0.2044$ nm.

The mixed crystal compositions are located in the following range:

$0.39 \leq Ca \leq 0.49$; $0 \leq Mg \leq 0.20$; $0.49 \leq Hf \leq 0.60$ and $0.18 \leq [Y] \leq 0.19$.

5. $\{Er_{3-x}Ca_x\}[Ga_{2-x-y-2z}(Er,In)_yMg_zHf_{x+z}](Ga_3)O_{12}$ (Er-curve FIG. 1)

The initial member of the mixed crystal series is defined by the formula $\{Er_{2.45}Ca_{0.55}\}[Ga_{1.17}Er_{0.18}Hf_{0.55}In_{0.10}](Ga_3)O_{12}$ wherein the bond lengths for the dodecahedral site and for the octahedral site amount to:

$\{A(1)\text{-}O\} = 0.2364$ nm, $[B\text{-}O] = 0.2038$ nm.

The terminal member of the mixed crystal series is described by the formula:

$\{Er_{2.51}Ca_{0.49}\}[Ga_{1.01}Er_{0.18}Mg_{0.11}Hf_{0.60}In_{0.10}](Ga_3)O_{12}$ wherein the bond lengths for the dodecahedral site and for the octahedral site amount to:

$\{A(1)\text{-}O\} = 0.2365$ nm, $[B\text{-}O] = 0.2044$ nm.

The mixed crystal compositions are located in the following range:

$0.49 \leq Ca \leq 0.55$; $0 \leq Mg \leq 0.11$; $0 \leq Hf \leq 0.60$;

$[Er]$ to 0.24; In to 0.10.

The distribution coefficient of erbium in the octahedral site exceeds 1. By an additional substitution of indium for gallium in the octahedral site, the distribution coefficient $k_{eff(Er)}$ can be reduced to some extent (cf. the examples no. 12 and no. 13 in the Table no. 1).

The narrow mixing range and the distribution coefficient $k_{eff(Er)}$ greater than 1 indicate that the host lattice of erbium-gallium-garnet constitutes the lower limit for the mixed crystal group having Ca, Mg and Hf as their substituents.

The curves of FIG. 1 illustrate the influence of the host lattice on the bond lengths. For all the initial members of the mixed crystal systems of the mixed crystal group I the empirical equations hold:

$$\{A(1)\text{-}O\} = 0.30362 - 1.4571 \cdot \{r_{RE}\} + 7.8443 \cdot \{r_{RE}\}^2 \text{ (in Nanometers)} \tag{8}$$

$$[B\text{-}O] = 0.25836 - 0.5436 \cdot \{r_{RE}\} \text{ (in Nanometers)} \tag{9}$$

Within the mixed crystal series the two bond lengths increase continuously versus an increasing Mg and Hf content. The increase in the bond lengths can be obtained from the following equations:

$$\Delta\{A(1)\text{-}O\} = 0.1024 \cdot [\Delta \bar{r}] + 19.8482 \cdot [\Delta \bar{r}]^2 \text{ (in Nanometers)} \tag{10}$$

$$\Delta[B\text{-}O] = 0.6802 \cdot [\Delta \bar{r}] \text{ (in Nanometers)} \tag{11}$$

In the equations (10) and (11), $[\Delta \bar{r}]$ denotes the radius differences of the average octahedral radii between the initial member and a substituted (Mg-containing) composition. The calculated bond length difference is added to the average bond length of the initial member of the mixed crystal series.

The change in the average bond lengths of the tetrahedral site in dependence on the composition has not been shown. It is basically less compared with the change of the two other lattice sites and is not more than $4 \cdot 10^{-4}$ nm at its maximum. For the cation occupation of the tetrahedral site the change in the average bond lengths in the tetrahedral site (C-O) is of no significance.

The limits of the mixed crystal formation have been reached when the functional values of the curves of FIG. 1 can no longer be satisfied.

As regards the rare earth metal ions (RE$^{3+}$) occupying the dodecahedral site, it is known that in the rare earth metal-gallium-garnet, portions of this rare earth metal in quantities exceeding 3 formula units additionally occupy the octahedral sites in the lattice (see, for example, J. of Cryst. Growth, 26 (1974), pages 169 to 170. This effect is also observed in mixed crystals on the basis of rare earth metal-gallium-garnet. The concentration of the rare earth metal ion in the octahedral site increases versus decreasing radii of the rare earth metals.

With a coupled substitution in a lattice site there is in the mixed crystal group I only one garnet composition having a distribution coefficient keff(cat) near 1, namely the terminal member of the gadolinium-mixed crystal series having the composition $$\{Gd_3\}[Ga_{1.59}Gd_{0.01}Mg_{0.20}Hf_{0.20}](Ga_3)O_{12}$$

A coupled substitution in two lattice sites (Ca and Hf) provides for each mixed crystal series within the mixed crystal group I a garnet composition having distribution coefficients near 1, namely all the initial members of the mixed crystal series.

A coupled substitution with three cations in different lattice sites—Ca in the dodecahedral site and Mg+Hf in the octahedral site—renders it possible to form a mixed crystal series having a plurality of mixed crystal systems with distribution coefficients $k_{eff(kat)}$ near 1. This is obtained with a decreasing Ca-concentration versus increasing Mg and Hf concentrations.

The lattice constants $a_o$ for the garnet compositions in accordance with the mixed crystal group I are shown in FIG. 1 at the right hand picture edge as a block diagram. A characteristic feature for this mixed crystal group is that all the initial members of the mixed crystal series have a lattice constant of $a_o=1.240$ nm. The change in the lattice constant $a_o$ caused by the radii of the reare earth metals of the host lattice is compensated by incorporating corresponding portions of $\{Ca^{2+}\}$, 8 $Hf^{4+}]$ and $[RE^{3+}]$ ions. Within a mixed crystal series the lattice constant $a_o$ increases continuously versus increasing Mg and Hf content. The maximum change in the lattice constant is different in each system. In the mixed crystal system for terbium-garnet the lattice constant $a_o$ can be varied in the range from 1.240 to 1.246.

Consequently, the different mixed crystal systems have the possibility to select specific single crystals of different compositions but having the same lattice constant. Consequently, single crystals can be grown which because of their composition has different properties but nevertheless have the same lattice constant.

Single crystals are produced from melts of the described mixed crystal systems using the Czochralski-method. Table 1 shows the specific values for the melt and crystal compositions, the bond lengths of the lattice site, the distribution coefficients $k_{eff(kat)}$, the lattice constant $a_o$ (calculated and measured), the average radius $\bar{r}$ for the cations of the dodecahedral site and of the octahedral site and the dimensions of drawn crystals (length L, diameter $\phi$) for mixed crystals of the mixed crystal group I. The average bond lengths of these compositions are marked in FIG. 1 by an asterisk. The single crystals have diameters in the range from 18 to 20 mm and crystal lengths in the range from 40 to 61 mm. The dislocation density and number of inclusions is $<10$ cm$^{-2}$. The crystal quality of single crystals is comparable to the quality of non-substituted rare earth metal-gallium-garnets.

TABLE 1

| Nr. | | Melt (I) Crystal composition (II), bond lengths $\{A(1)\text{-}0\}$ $\{A(2)\text{-}0\}$ $[B\text{-}0]$ $(C\text{-}0)$ in nm (III) and $K_{eff}$(IV) | | | | | | $a_0$ calc nm | $a_0$ meas nm | $\{\bar{r}\}$ nm | $[\bar{r}]$ nm | L mm | $\phi$ mm |
|---|---|---|---|---|---|---|---|---|---|---|---|---|---|
| | | | | Gadolinium-Garnet | | | | | | | | | |
| 1 | (I) | $\{Gd_{2.85}$ | $Ca_{0.15}\}$ | $[Ga_{1.83}$ | $Gd_{0.02}$ | | $Hf_{0.15}]$ | $(Ga_{3.00})O_{12}$ | 1.240 | | 0.10642 | 0.06208 | | |
| | (II) | $\{Gd_{2.86}$ | $Ca_{0.14}\}$ | $[Ga_{1.83}$ | $Gd_{0.02}$ | | $Hf_{0.15}]$ | $(Ga_{3.00})O_{12}$ | 1.240 | 1.2406 | | | 55 | 18 |
| | (III) | $\{0.2374\}$ | $\{0.2468\}$ | $[0.2008]$ | | | | (0.1852) | | | | | | |
| | (IV) | 1.00 | 0.93 | 1.00 | | | 1.00 | | | | | | | |
| 2 | (I) | $\{Gd_{3.00}\}$ | | $[Ga_{1.59}$ | $Gd_{0.01}$ | $Mg_{0.20}$ | $Hf_{0.20}]$ | $(Ga_{3.00})O_{12}$ | 1.241 | | 0.10610 | 0.06326 | | |
| | (II) | $\{Gd_{3.00}\}$ | | $[Ga_{1.59}$ | $Gd_{0.01}$ | $Mg_{0.20}$ | $Hf_{0.20}]$ | $(Ga_{3.00})O_{12}$ | 1.241 | 1.2423 | | | 61 | 20 |
| | (III) | $\{0.2375\}$ | $\{0.2467\}$ | $[0.2016]$ | | | | (0.1851) | | | | | | |
| | (IV) | 1.00 | | 1.00 | | 1.00 | 1.00 | | | | | | | |
| | | | | Terbium-Garnet | | | | | | | | | |
| 3 | (I) | $\{Tb_{2.65}$ | $Ca_{0.35}\}$ | $[Ga_{1.62}$ | $Tb_{0.03}$ | | $Hf_{0.35}]$ | $(Ga_{3.00})O_{12}$ | 1.240 | | 0.10533 | 0.06322 | | |
| | (II) | $\{Tb_{2.66}$ | $Ca_{0.34}\}$ | $[Ga_{1.61}$ | $Tb_{0.03}$ | | $Hf_{0.36}]$ | $(Ga_{3.00})O_{12}$ | 1.240 | 1.2406 | | | 55 | 18 |
| | (III) | $\{0.2370\}$ | $\{0.2462\}$ | $[0.2015]$ | | | | (0.1851) | | | | | | |
| | (IV) | 1.00 | 0.97 | 0.99 | | | 1.03 | | | | | | | |
| 4 | (I) | $\{Tb_{2.83}$ | $Ca_{0.17}\}$ | $[Ga_{1.23}$ | $Tb_{0.02}$ | $Mg_{0.29}$ | $Hf_{0.46}]$ | $(Ga_{3.00})O_{12}$ | 1.242 | | 0.10485 | 0.06521 | | |
| | (II) | $\{Tb_{2.83}$ | $Ca_{0.17}\}$ | $[Ga_{1.21}$ | $Tb_{0.02}$ | $Mg_{0.30}$ | $Hf_{0.47}]$ | $(Ga_{3.00})O_{12}$ | 1.242 | 1.2435 | | | 55 | 18 |
| | (III) | $\{0.2373\}$ | $\{0.2461\}$ | $[0.2028]$ | | | | (0.1850) | | | | | | |
| | (III) | 1.00 | 1.00 | 0.98 | | 1.03 | 1.02 | | | | | | | |
| 5 | (I) | $\{Tb_{2.95}$ | $Ca_{0.05}\}$ | $[Ga_{0.83}$ | $Tb_{0.02}$ | $Mg_{0.55}$ | $Hf_{0.60}]$ | $(Ga_{3.00})O_{12}$ | 1.244 | | 0.10453 | 0.06734 | | |
| | (II) | $\{Tb_{2.94}$ | $Ca_{0.06}\}$ | $[Ga_{0.83}$ | $Tb_{0.02}$ | $Mg_{0.55}$ | $Hf_{0.60}]$ | $(Ga_{3.00})O_{12}$ | 1.244 | 1.2460 | | | 60 | 18 |
| | (III) | $\{0.2377\}$ | $\{0.2462\}$ | $[0.2043]$ | | | | (0.1849) | | | | | | |
| | (IV) | 1.00 | 1.20 | 1.00 | | 1.00 | 1.00 | | | | | | | |
| | | | | Dysprosium-Garnet | | | | | | | | | |
| 6 | (I) | $\{Dy_{2.62}$ | $Ca_{0.38}\}$ | $[Ga_{1.51}$ | $Dy_{0.11}$ | | $Hf_{0.38}]$ | $(Ga_{3.00})O_{12}$ | 1.240 | | 0.10419 | 0.06457 | | |
| | (II) | $\{Dy_{2.52}$ | $Ca_{0.38}\}$ | $[Ga_{1.50}$ | $Dy_{0.11}$ | | $Hf_{0.39}]$ | $(Ga_{3.00})O_{12}$ | 1.240 | 1.2397 | | | 40 | 20 |
| | (III) | $\{0.2367\}$ | $\{0.2455\}$ | $[0.2022]$ | | | | (0.1850) | | | | | | |
| | (IV) | 1.00 | 1.00 | 0.99 | | | 1.03 | | | | | | | |
| 7 | (I) | $\{Dy_{2.75}$ | $Ca_{0.25}\}$ | $[Ga_{1.06}$ | $Dy_{0.05}$ | $Mg_{0.32}$ | $Hf_{0.57}]$ | $(Ga_{3.00})O_{12}$ | 1.241 | | 0.10378 | 0.06636 | | |
| | (II) | $\{Dy_{2.74}$ | $Ca_{0.26}\}$ | $[Ga_{1.06}$ | $Dy_{0.06}$ | $Mg_{0.31}$ | $Hf_{0.57}]$ | $(Ga_{3.00})O_{12}$ | 1.241 | 1.2428 | | | 60 | 20 |
| | (III) | $\{0.2369\}$ | $\{0.2455\}$ | $[0.2034]$ | | | | (0.1849) | | | | | | |
| | (IV) | 1.00 | 1.04 | 1.00 | | 0.97 | 1.00 | | | | | | | |
| 8 | (I) | $\{Dy_{2.75}$ | $Ca_{0.25}\}$ | $[Ga_{1.00}$ | $Dy_{0.05}$ | $Mg_{0.35}$ | $Hf_{0.60}]$ | $(Ga_{3.00})O_{12}$ | 1.242 | | 0.10378 | 0.06668 | | |
| | (III) | $\{0.2370\}$ | $\{0.2455\}$ | $[0.2036]$ | | | | (0.1849) | | | | | | |
| | | | | Yttrium-Garnet | | | | | | | | | |
| 9 | (I) | $\{Y_{2.51}$ | $Ca_{0.49}\}$ | $[Ga_{1.33}$ | $Y_{0.18}$ | | $Hf_{0.49}]$ | $(Ga_{3.00})O_{12}$ | 1.240 | | 0.10336 | 0.06606 | | |
| | (II) | $\{Y_{2.52}$ | $Ca_{0.48}\}$ | $[Ga_{1.33}$ | $Y_{0.18}$ | | $Hf_{0.49}]$ | $(Ga_{3.00})O_{12}$ | 1.240 | 1.2400 | | | 60 | 20 |
| | (III) | $\{0.2366\}$ | $\{0.2451\}$ | $[0.2031]$ | | | | (0.1849) | | | | | | |
| | (IV) | 1.00 | 0.98 | 1.00 | | | 1.00 | | | | | | | |
| 10 | (I) | $\{Y_{2.60}$ | $Ca_{0.40}\}$ | $[Ga_{1.13}$ | $Y_{0.19}$ | $Mg_{0.14}$ | $Hf_{0.54}]$ | $(Ga_{3.00})O_{12}$ | 1.241 | | 0.10304 | 0.06723 | | |
| | (II) | $\{Y_{2.61}$ | $Ca_{0.39}\}$ | $[Ga_{1.13}$ | $Y_{0.19}$ | $Mg_{0.14}$ | $Hf_{0.54}]$ | $(Ga_{3.00})O_{12}$ | 1.241 | 1.2414 | | | 50 | 20 |

TABLE 1-continued

| Nr. | | Melt (I) Crystal composition (II), bond lengths {A(1)-0} {A(2)-0} [B-0] (C-0) in nm (III) and $K_{eff}$(IV) | | | | | | $a_0$ calc nm | $a_0$ meas nm | {r} nm | [r] nm | L mm | φ |
|---|---|---|---|---|---|---|---|---|---|---|---|---|---|
| | (III) | {0.2367} | {02451} | [0.2039] | | | (0.1848) | | | | | | |
| | (IV) | 1.00 | 0.98 | 1.00 | | 1.00 | | | | | | | |
| 11 | (I) | {Y$_{2.60}$} | Ca$_{0.40}$} | [Ga$_{1.01}$] | Y$_{0.19}$ | Mg$_{0.20}$ 1.00 | Hf$_{0.60}$] (Ga$_{3.00}$)O$_{12}$ | 1.2420 | | 0.10304 | 0.06786 | | |
| | (III) | {0.2369} | {0.2452} | [0.2044] | | | (0.1848) | | | | | | |
| | | | | Erbium-Garnet | | | | | | | | | |
| 12 | (I) | {Er$_{2.45}$} | Ca$_{0.55}$} | [Ga$_{1.27}$] | Er$_{0.18}$ | | Hf$_{0.55}$] (Ga$_{3.00}$)O$_{12}$ | 1.239 | | 0.10260 | 0.06627 | | |
| | (II) | {Er$_{2.47}$} | Ca$_{0.53}$} | [Ga$_{1.21}$] | Er$_{0.24}$ | | Hf$_{0.55}$] (Ga$_{3.00}$)O$_{12}$ | 1.240 | 1.2395 | | | 50 | 20 |
| | (III) | {0.2361} | {0.2446} | [0.2031] | | | (0.1848) | | | | | | |
| | (III) | 1.03 | 0.96 | 0.95 | | 1.00 | | | | | | | |
| 13 | (I) | {Er$_{2.45}$} | Ca$_{0.55}$} | [Ga$_{1.17}$] | Er$_{0.18}$ | In$_{0.10}$ | Hf$_{0.55}$] (Ga$_{3.00}$)O$_{12}$ | 1.240 | | 0.10260 | 0.06718 | | |
| | (II) | {Er$_{2.46}$} | Ca$_{0.54}$} | [Ga$_{1.17}$] | Er$_{0.20}$ | In$_{0.07}$ | Hf$_{0.56}$] (Ga$_{3.00}$)O$_{12}$ | 1.240 | 1.2406 | | | 58 | 18 |
| | (III) | {0.2364} | {0.2447} | [0.2038] | | | (0.1848) | | | | | | |
| | (III) | 1.01 | 0.98 | 1.00 | | 1.02 | | | | | | | |
| 14 | (I) | {Er$_{2.51}$} | Ca$_{0.49}$} | [Ga$_{1.01}$] | Er$_{0.18}$ | In$_{0.10}$ | Mg$_{0.11}$ Hf$_{0.60}$] (Ga$_{3.00}$)O$_{12}$ | 1.241 | | 0.10236 | 0.06804 | | |
| | (III) | {0.2365} | {0.2447} | [0.2044] | | | (0.1848) | | | | | | |

Mixed crystal group II having a composition defined by the general formula:

$$\{RE_{3-x}Ca_x\}[Ga_{2-x-y-2z}RE_yMg_zZr_{x+z}](Ga_3)O_{12} \text{ wherein}$$

$RE = Sm^{3+}$, $Eu^{3+}$, $Gd^{3+}$, $Tb^{3+}$ and wherein $0 \leq x \leq 0.58$ $0 \leq y \leq 0.10$ $0 \leq z \leq 0.50$ $0.15 \leq x+z \leq 0.68$ The mixed crystal group II is formed by four mixed crystal systems with the rare earth metals $RE = Sm^{3+}$, $Eu^{3+}$, $Gd^{3+}$, $Tb^{3+}$ Contrary to the mixed crystal group I these mixed crystals contain zirconium as the substituents instead of hafnium in the octahedral site. Both mixed crystal groups I and II have comparable association as regards the mixed crystal formation. As a parameter for the description of the four mixed crystal systems of the mixed crystal group II also the bond lengths {A(1)-0} and [B-0] of the dodecahedral and octahedral sites are used. The bond lengths are calculated using the equations (12) to (15) mentioned hereinafter.

The mixed crystals of the four mixed crystal systems are the mixed crystal group II have the following compositions:

1. $\{Tb_{3-x}Ca_x\}[Ga_{2-x-y-2z}Tb_yMg_zZr_{x+z}](Ga_3)O_{12}$
(Tb-curve FIG. 3)

The initial member of the mixed crystal series is defined by the formula $$\{Tb_{2.42}Ca_{0.58}\}[Ga_{1.34}Tb_{0.08}Zr_{0.58}](Ga_3)O_{12},$$

wherein the bond lengths for the dodecahedral site and for the octahedral site amount to:

$\{A(1)\text{-}0\} = 0.2383$ nm, $[B\text{-}0] = 0.2037$ nm.

The terminal member of the mixed crystal series is defined by the formula $$\{Tb_{2.48}Ca_{0.52}\}[Ga_{1.22}Tb_{0.10}Mg_{0.08}Zr_{0.60}](Ga_3)O_{12}$$

wherein the bond lengths for the dodecahedral site and for the octahedral site amount to:

$\{A(1)\text{-}0\} = 0.2384$ nm, $[B\text{-}0] = 0.2043$ nm.

The mixed crystal compositions are located in the following range:

$0.50 \leq Ca \leq 0.58$; $0 \leq Mg \leq 0.08$; $0.58 \leq Zr \leq 0.60$ and $0.07 \leq [Tb] \leq 0.10$ 2. $\{Gd_{3-x}Ca_x\}[Ga_{2-x-y-2z}Gd_yMg_zZr_{x+z}](Ga_3)O_{12}$
(Gd-curve FIG. 3)

The initial member of the mixed crystal series is defined by the formula:

$$\{Gd_{2.55}Ca_{0.45}\}[Ga_{1.51}Gd_{0.04}Zr_{0.45}](Ga_3)O_{12}$$

wherein the bond lengths for the dodecahedral site and for the octahedral site amount to:

$\{A(1)\text{-}0\} = 0.2386$ nm, $[B\text{-}0] = 0.2386$ nm.

The terminal member of the mixed crystal series is defined by the formula:

$$\{Gd_{2.68}Ca_{0.32}\}[Ga_{0.93}Gd_{0.03}Mg_{0.36}Zr_{0.68}](Ga_3)O_{12}$$

wherein the bond lengths for the dodecahedral site and for the octahedral site amount to:

$\{A(1)\text{-}0\} = 0.2394$ nm, $[B\text{-}0] = 0.2052$ nm.

The mixed crystal compositions are located in the following range:

$0.32 \leq Ca \leq 0.45$; $0 \leq Mg \leq 0.36$; $0.45 \leq Zr \leq 0.68$ and $0.03 \leq [Gd] \leq 0.05$.

3. $\{Eu_{3-x}Ca_x\}[Ca_{2-x-y-2z}Eu_yMg_zZr_{x+z}](Ga_3)O_{12}$
(Eu-curve FIG. 3)

The initial member of the mixed crystal series is defined by the formula:

$$\{Eu_{2.68}Ca_{0.32}\}[Ga_{1.66}Eu_{0.02}Zr_{0.32}](Ga_3)O_{12}$$

wherein the bond lengths for the dodecahedral site and for the octahedral site amount to:

$\{A(1)\text{-}0\} = 0.2387$ nm, $[B\text{-}0] = 0.2021$ nm.

The terminal member of the mixed crystal series is defined by the formula:

$$\{Eu_{2.94}Ca_{0.06}\}[Ga_{0.95}Eu_{0.01}Mg_{0.49}Zr_{0.55}](Ga_3)O_{12}$$

wherein the bond lengths for the dodecahedral site and for the octahedral site amount to:

$\{A(1)\text{-}0\} = 0.2397$ nm, $[B\text{-}0] = 0.2050$ nm.

The mixed crystal compositions are located in the following range:

$0.06 \leq Ca \leq 0.32; 0 \leq Mg \leq 0.50; 0.32 \leq Zr \leq 0.56$ and $0.01 \leq [Eu] \leq 0.02$ 4. $\{Sm_{3-x}Ca_x\}[Ga_{2-x-y-2z}Sm_yMg_zZr_{x+y}](Ga_3)O_{12}$ (Sm-curve FIG. 3)

The initial member of the mixed crystal series is defined by the formula:

$$\{Sm_{2.85}Ca_{0.15}\}[Ga_{1.85}Zr_{0.15}](Ga_3)O_{12}$$

wherein the bond lengths for the dodecahedral site and for the octahedral site amount to:

$\{A(1)\text{-}0\} = 0.2390$ nm, $[B\text{-}0] = 0.2013$ nm.

The terminal member of the mixed crystal series is defined by the formula:

$$\{Sm_3\}[Ga_{1.60}Mg_{0.20}Zr_{0.20}](Ga_3)O_{12}$$

wherein the bond lengths for the dodecahedral site and for the octahedral site amount to:

$\{A(1)\text{-}0\} = 0.2393$ nm, $[B\text{-}0] = 0.2022$ nm.

The mixed crystal compositions are located in the following range:

$0 \leq Ca \leq 0.15; 0 \leq Mg. \leq 0.20; 0.15 \leq Zr \leq 0.20$ and $0 \leq [Sm] \leq 0.01$.

The bond lengths of the dodecahedral and octahedral sites of garnet compositions having distribution coefficients $k_{eff(kat)}$ near 1 for crystals of the mixed crystal group II are shown in the diagram of FIG. 3. Both the bond lengths for the dodecahedral site and also the bond lengths for the octahedral site increase versus increasing a radius of the rare earth metal and versus increasing Mg or Zr concentrations.

Calculating the average bond lengths of all the initial member of the mixed crystal series for mixed crystals of the mixed crystal group II can be performed in accordance with the equations:

$$\{A(1)\text{-}0\} = 0.25119 - 0.4027.\{r_{RE}\} + 2.6730.\{r_{RE}\}^2 \text{ (in Nanometer)} \quad (12)$$

$$[B\text{-}0] = 0.26266 - 0.5645.\{r_{RE}\} \text{ (in Nanometer)} \quad (13)$$

For the average bond lengths within a mixed crystal series for mixed crystals of the mixed crystal group II it holds that:

$$\Delta\{A(1)\text{-}0\} = 0.2070.[\overline{\Delta r}] + 6.0593.[\overline{\Delta r}]^2 \text{ (in Nanometer)} \quad (14)$$

$$\Delta[B\text{-}0] = 0.6961.[\overline{\Delta r}] \text{ (in Nanometer)} \quad (15)$$

The factors of the equations 12 to 15 for calculating the bond lengths or the average bond lengths for mixed crystals of the mixed crystal group II are changed somewhat compared with the factors of the equations (8) to (11) for calculating the bond lengths or the average bond lengths for mixed crystals of the mixed crystal group I. This change is based on the different influence of hafnium on the one side and zirconium on the other side on the average bond lengths.

The lattice constant $a_o$ for mixed crystals of the mixed crystal group II can be varied in the range from 1.245 to 1.252 nm. All the initial members of the corresponding mixed crystal series have a lattice constant $a_o = 1.245$ nm (cf. FIG. 3). Also here it appears that mixed crystals can be grown from melts of oxidic multicomponent systems having different compositions but the same lattice constant. Thus, single crystals having very different physical properties because of their different composition can be obtained at equal lattice constant. This does not hold for single crystals having a cubic crystal structure, such as, for example, garnets, but for mixed crystals from melts of oxidic multi7component systems in its generality. For technical applications, mixed crystals having a spinel or perowskite structure are, for example, of like interest as mixed crystals having a garnet structure.

Single crystals are produced from melts of the four mixed crystal systems in accordance with the mixed crystal group II, in accordance with the Czochralski method. All the values for the melts and crystal composition, the bond lengths of the lattice sites, the distribution coefficients $k_{eff(kat)}$, the lattice constants $a_o$ (calculated and measured), the average radius $\overline{r}$ for the cations of the dodecahedral and of the octahedral site and the dimensions of drawn single crystals (length L, diameter $\phi$) for mixed crystals of the mixed crystal group II are shown in Table 2.

The average bond lengths of these compositions are marked in FIG. 3 by an asterisk. The single crystals have diameters from 20 to 100 mm and crystal lengths from 55 to 150 mm. The dislocation density and the number of inclusions is $<10$ cm$^{-2}$.

TABLE 2

| Nr. | | Melt (I) Crystal composition (II), bond lengths {A(1)-0} {A(2)-0} [B-0] (C-0) in nm (III) and K$_{eff}$(IV) | | | | | | $a_0$ calc nm | $a_0$ meas nm | $\{\overline{r}\}$ nm | $[\overline{r}]$ nm | L mm | $\phi$ mm |
|---|---|---|---|---|---|---|---|---|---|---|---|---|---|
| | | | | Samarium-Garnet | | | | | | | | | |
| 15 | (I) | {Sm$_{2.85}$} | Ca$_{0.15}$} | [Ga$_{1.85}$] | | | Zr$_{0.15}$] | (Ga$_{3.00}$)O$_{12}$ | 1.245 | | 0.10888 | 0.06201 | | |
| | (II)* | {Sm$_{2.86}$} | Ca$_{0.14}$} | [Ga$_{1.85}$] | | | Zr$_{0.15}$] | (Ga$_{3.00}$)O$_{12}$ | 1.245 | 1.2454 | | | | |
| | (III) | {0.2390} | {0.2487} | [0.2013] | | | | (0.1853) | | | | | | |
| | (IV) | 1.00 | 0.93 | 1.00 | | | 1.00 | | | | | | | |
| 16 | (I) | {Sm$_{3.00}$} | | [Ga$_{1.60}$] | | Mg$_{0.20}$ | Zr$_{0.20}$] | (Ga$_{3.00}$)O$_{12}$ | 1.247 | | 0.10870 | 0.06345 | | |
| | (II) | {Sm$_{3.00}$} | | [Ga$_{1.59}$] | Sm$_{0.01}$ | Mg$_{0.20}$ | Zr$_{0.20}$] | (Ga$_{3.00}$)O$_{12}$ | 1.247 | 1.2476 | | | 100 | 35 |
| | (III) | {0.2393} | {0.2487} | [0.2022] | | | | (0.1853) | | | | | | |
| | (IV) | 1.00 | | 0.99 | | 1.00 | 1.00 | | | | | | | |

TABLE 2-continued

| Nr. | | Melt (I) Crystal composition (II), bond lengths {A(1)-0} {A(2)-0} [B-0] (C-0) in nm (III) and $K_{eff}$(IV) | | | | | | $a_0$ calc nm | $a_0$ meas nm | $\{r\}$ nm | $[r]$ nm | L mm | $\phi$ mm |
|---|---|---|---|---|---|---|---|---|---|---|---|---|---|
| | | | | Europium-Garnet | | | | | | | | | |
| 17 | (I) | {Eu$_{2.68}$ | Ca$_{0.32}$} | [Ga$_{1.66}$ | Eu$_{0.02}$ | | Zr$_{0.32}$] | (Ga$_{3.00}$)O$_{12}$ | 1.245 | | 0.10784 | 0.06350 | | |
| | (II)* | {Eu$_{2.68}$ | Ca$_{0.32}$} | [Ga$_{1.65}$ | Eu$_{0.02}$ | | Zr$_{0.33}$] | (Ga$_{3.00}$)O$_{12}$ | 1.245 | 1.2460 | | | | |
| | (III) | {0.2387} | {0.2481} | [0.32021] | | | | (0.1852) | | | | | | |
| | (IV) | 1.00 | 1.00 | 0.99 | | | 1.03 | | | | | | | |
| 18 | (I) | {Eu$_{2.882}$ | Ca$_{0.118}$} | [Ga$_{1.236}$ | | Mg$_{0.323}$ | Zr$_{0.441}$] | (Ga$_{3.00}$)O$_{12}$ | 1.248 | | 0.10750 | 0.6575 | | |
| | (II) | {Eu$_{2.89}$ | Ca$_{0.11}$} | [Ga$_{1.20}$ | Eu$_{0.01}$ | Mg$_{0.34}$ | Zr$_{0.45}$] | (Ga$_{3.00}$)O$_{12}$ | 1.248 | 1.2492 | | | 55 | 20 |
| | (III) | {0.2392} | {0.2481} | [0.2037] | | | | (0.1851) | | | | | | |
| | (IV) | 1.01 | 0.93 | 0.97 | | 1.05 | 1.02 | | | | | | | |
| 19 | (I) | {Eu$_{2.94}$ | Ca$_{0.06}$} | [Ga$_{0.95}$ | Eu$_{0.01}$ | Mg$_{0.49}$ | Zr$_{0.55}$] | (Ga$_{3.00}$)O$_{12}$ | 1.251 | | 0.10730 | 0.06856 | | |
| | (II)* | {Eu$_{2.94}$ | Ca$_{0.06}$} | [Ga$_{0.93}$ | Eu$_{0.01}$ | Mg$_{0.50}$ | Zr$_{0.56}$] | (Ga$_{3.00}$)O$_{12}$ | 1.251 | 1.2517 | | | | |
| | (III) | {0.2397} | {0.2483} | [0.2050] | | | | (0.1851) | | | | | | |
| | (IV) | 1.00 | 1.00 | 0.97 | | 1.02 | 1.02 | | | | | | | |
| | | | | Gadolinium-Garnet | | | | | | | | | |
| 20 | (I) | {Gd$_{2.55}$ | Ca$_{0.45}$} | [Ga$_{1.51}$ | Gd$_{0.04}$ | | Zr$_{0.45}$] | (Ga$_{3.00}$)O$_{12}$ | 1.245 | | 0.10704 | 0.6470 | | |
| | (III) | {0.2386} | {0.2476} | [0.2028] | | | | (0.1851) | | | | | | |
| 21 | (I) | {Gd$_{2.65}$ | Ca$_{0.35}$} | [Ga$_{1.35}$ | | Mg$_{0.15}$ | Zr$_{0.50}$] | (Ga$_{3.00}$)O$_{12}$ | 1.246 | | 0.10684 | 0.06520 | | |
| | (II) | {Gd$_{2.65}$ | Ca$_{0.35}$} | [Ga$_{1.32}$ | Gd$_{0.05}$ | Mg$_{0.14}$ | Zr$_{0.49}$] | (Ga$_{3.00}$)O$_{12}$ | 1.247 | 1.2464 | | | 80 | 42 |
| | (III) | {0.2386} | {0.2476} | [0.2031] | | | | (0.1851) | | | | | | |
| | (IV) | 1.02 | 1.00 | 0.98 | | 0.93 | 0.98 | | | | | | | |
| 22 | (I) | {Gd$_{2.665}$ | Ca$_{0.335}$} | [Ga$_{1.125}$ | Gd$_{0.03}$ | Mg$_{0.255}$ | Zr$_{0.59}$] | (Ga$_{3.00}$)O$_{12}$ | 1.248 | | 0.10680 | 0.06688 | | |
| | (II) | {Gd$_{2.67}$ | Ca$_{0.33}$} | [Ga$_{1.11}$ | Gd$_{0.03}$ | Mg$_{0.27}$ | Zr$_{0.59}$] | (Ga$_{3.00}$)O$_{12}$ | 1.248 | 1.2484 | | | 100 | 33 |
| | (III) | {0.2391} | {0.2478} | [0.2043] | | | | (0.1851) | | | | | | |
| | (IV) | 1.00 | 0.99 | 0.99 | | 1.06 | 1.00 | | | | | | | |
| 23 | (I) | {Gd$_{2.675}$ | Ca$_{0.325}$} | [Ga$_{0.99}$ | Gd$_{0.035}$ | Mg$_{0.325}$ | Zr$_{0.65}$] | (Ga$_{3.00}$)O$_{12}$ | 1.250 | | 0.10678 | 0.06775 | | |
| | (II) | {Gd$_{2.67}$ | Ca$_{0.33}$} | [Ga$_{1.00}$ | Gd$_{0.03}$ | Mg$_{0.32}$ | Zr$_{0.65}$] | (Ga$_{3.00}$)O$_{12}$ | 1.249 | 1.2499 | | | 150 | 100 |
| | (III) | {0.2393} | {0.2479} | [0.2050] | | | | (0.1850) | | | | | | |
| | (IV) | 1.00 | 1.02 | 1.01 | | 1.02 | 1.00 | | | | | | | |
| 24 | (I) | {Gd$_{2.68}$ | Ca$_{0.32}$} | [Ga$_{0.93}$ | Gd$_{0.03}$ | Mg$_{0.36}$ | Zr$_{0.68}$] | (Ga$_{3.00}$)O$_{12}$ | 1.250 | | 0.10677 | 0.06807 | | |
| | (III) | {0.2394} | {0.2479} | [0.2052] | | | | (0.1850) | | | | | | |
| | | | | Terbium-Garnet | | | | | | | | | |
| 25 | (I) | {Tb$_{2.42}$ | Ca$_{0.58}$} | [Ga$_{1.34}$ | Tb$_{0.08}$ | | Zr$_{0.58}$] | (Ga$_{3.00}$)O$_{12}$ | 1.245 | | 0.10595 | 0.06617 | | |
| | (II)* | {Tb$_{2.44}$ | Ca$_{0.56}$} | [Ga$_{1.35}$ | Tb$_{0.07}$ | | Zr$_{0.58}$] | (Ga$_{3.00}$)O$_{12}$ | 1.245 | 1.2452 | | | | |
| | (III) | {0.2383} | {0.2470} | [0.2037] | | | | (0.1850) | | | | | | |
| | (IV) | 1.01 | 0.97 | 1.01 | | | 1.00 | | | | | | | |
| 26 | (I) | {Tb$_{2.48}$ | Ca$_{0.52}$} | [Ga$_{1.22}$ | Tb$_{0.10}$ | Mg$_{0.08}$ | Zr$_{0.60}$] | (Ga$_{3.00}$)O$_{12}$ | 1.246 | | 0.10579 | 0.06706 | | |
| | (II) | {Tb$_{2.50}$ | Ca$_{0.50}$} | [Ga$_{1.22}$ | Tb$_{0.10}$ | Mg$_{0.08}$ | Zr$_{0.60}$] | (Ga$_{3.00}$)O$_{12}$ | 1.246 | 1.2455 | | | 60 | 20 |
| | (III) | {0.2384} | {0.2470} | [0.2043] | | | | (0.1850) | | | | | | |
| | (IV) | 1.01 | 0.96 | 1.00 | | 1.00 | 1.00 | | | | | | | |

Mixed crystal group III having the composition defined by the general formula $$\{RE_{3-u-v}Ca_uMg_v\}[In_{2-w-x}Mg_wZr_x](Ga_{3-y-z}Ge_yMg_z)O_{12}$$

wherein $RE = Pr^{3+}$ or $Nd^{3+}$ and wherein $0 \leq u \leq 0.60$ $0 \leq v \leq 0.06$ $1.25 \leq w \leq 1.50$ $0 \leq x \leq 0.50$ $1.31 \leq y \leq 1.60$ $0.03 \leq z \leq 0.15$ The mixed crystal formation occurs for this mixed crystal group via a coupled substitution in three different lattice sites (dodecahedron site, octahedral site, tetrahedral site) in accordance with the same principle as in the mixed crystal groups I and II described in the foregoing. Within the mixed crystal group III the following mixed crystal systems are produced:

1. $\{Pr_{3-u-v}Ca_uMg_v\}[In_{2-w-x}Mg_wZr_x](Ga_{3-y-z}Ge_yMg_z)O_{12}$

The initial member of the mixed crystal series is defined by the formula:

$$\{Pr_{2.97}Mg_{0.03}\}[In_{0.67}Mg_{1.33}](Ga_{1.42}Ge_{1.47}Mg_{0.1-1})O_{12}$$

wherein the bond lengths for the dodecahedral site and for the octahedral site amount to:

$\{A(1)\text{-}0\} = 0.2453$ nm, $[B\text{-}0] = 02108$ nm

The terminal member of the mixed crystal series is defined by the formula:

$$\{Pr_{2.77}Ca_{0.20}Mg_{0.03}\}[In_{0.40}Mg_{1.35}Zr_{0.25}]$$

$$(Ga_{1.37}Ge_{1.48}Mg_{0.15})O_{12}$$

wherein the bond lengths for the dodecahedral site and for the octahedral site amount to:

$\{A(1)\text{-}0\} = 0.2451$ nm, $[B\text{-}0] = 0.2103$ nm

The mixed crystal compositions are located in the following range:

$0 \leq Ca \leq 0.20$; $0.03 \leq \{Mg\} \leq 0.06$; $1.33 \leq [Mg] \leq 1.36$ $0 \leq Zr \leq 0.25$; $1.47 \leq Ge \leq 1.50$; $0.08 \leq (Mg) \leq 0.15$ 2. $\{Nd_{3-u-v}Ca_uMg_v\}[In_{2-w-x}Mg_wZr_x](Ga_{3-y-z}Ge_yMg_z)O_{12}$ The initial member of the mixed crystal series is defined by the formula:

$$\{Nd_{2.97}Mg_{0.03}\}[In_{0.74}Mg_{1.26}](Ga_{1.63}Ge_{1.33}Mg_{0.04})O_{12}$$

wherein the bond lengths for the dodecahedral site and for the octahedral site amount to:

$$\{A(1)\text{-}0\}=0.2443 \text{ nm}, [B\text{-}0]=0.2107 \text{ nm}.$$

All the values for the melt and crystal composition, the bond lengths of the lattice sites, the distribution coefficients $k_{eff(kat)}$, the lattice constants a (calculated and measured), the average radius $\bar{r}$ for the cations of the dodecahedral, the octahedral and the tetrahedral sites and the dimensions of drawn crystals (length L, diameter $\phi$) for mixed crystals of the mixed crystal group III are shown in Table 3.

The lattice constants $a_0$ for mixed crystals of the mixed crystal group III can be varied in the range from 1.264 to 1.2672 nm. The single crystals have diameters from 15 to 18 mm and crystal lengths from 35 to 62 mm. The dislocation density and the number of inclusions is $\leq 10$ cm$^{-2}$.

over a wide range. It is however equally possible to grow mixed crystals with always the same lattice constant, but with completely different compositions and consequently different properties. This is not only of significance as regards lattice constants of a monocrystalline substrate which are adapted to monocrystalline layers to be deposited, so relative to crystallographic properties, but also as regards the variability of further physical, for example optical and electro-optical, magnetical, electrical properties of the mixed crystal to be grown. Electrical properties include all the electrical transfer properties, such as, for example, superconduction, metallic lines, semiconducting and insulating properties.

We claim:

1. A homogeneous mixed crystal, grown from melts of oxidic multi-component systems, comprising dodecahedral lattice sites and octahedral lattice sites wherein the bond length ratio of dodecahedral cations to oxygen to that of octahedral cation to oxygen is in the range from 0.7–1.5 and having a composition of the formula $$\{RE_{3-x}Ca_x\}[Ga_{2-x-y-2z}R_yMg_zHf_{x+z}](Ga_3)O_{12}$$

wherein

TABLE 3

| Nr. | | Melt (I) Crystal composition (II), bond lengths $\{A(1)\text{-}0\}$ $\{A(2)\text{-}0\}$ [B-0] (C-0) in nm (III) and $K_{eff}$(IV) | | | | | | | | |
|---|---|---|---|---|---|---|---|---|---|---|
| | | Praseodym-Garnet | | | | | | | | |
| 27 | (I) | {Pr$_{2.97}$ | | Mg$_{0.03}$} | [In$_{0.67}$ | Mg$_{1.33}$] | | (Ga$_{1.42}$ | Ge$_{1.47}$ | Mg$_{0.11}$) O$_{12}$ |
| | (II) | {Pr$_{2.94}$ | | Mg$_{0.06}$} | [In$_{0.64}$ | Mg$_{1.36}$] | | (Ga$_{1.42}$ | Ge$_{1.50}$ | Mg$_{0.08}$) O$_{12}$ |
| | (III) | {0.2453} | {0.2543} | | [0.2108] | | | (0.1816) | | |
| | (IV) | 0.99 | | | 0.96 | 1.02 | | 1.00 | 1.02 | |
| 28 | (I) | {Pr$_{2.77}$ | Ca$_{0.20}$ | Mg$_{0.03}$} | [In$_{0.40}$ | Mg$_{1.35}$ | Zr$_{0.25}$] | (Ga$_{1.37}$ | Ge$_{1.48}$ | Mg$_{0.15}$) O$_{12}$ |
| | (II) | {Pr$_{2.77}$ | Ca$_{0.20}$ | Mg$_{0.03}$} | [In$_{0.41}$ | Mg$_{1.34}$ | Zr$_{0.23}$] | (Ga$_{1.36}$ | Ge$_{1.50}$ | Mg$_{0.14}$) O$_{12}$ |
| | (III) | {0.2451} | {0.2541} | | [0.2103] | | | (0.1817) | | |
| | (IV) | 1.00 | 1.00 | | 1.03 | 1.00 | 0.92 | 0.99 | 1.01 | |
| | | Neodym-Garnet | | | | | | | | |
| 29 | (I) | {Nd$_{2.97}$ | | Mg$_{0.03}$} | [In$_{0.74}$ | Mg$_{1.26}$] | | (Ga$_{1.63}$ | Ge$_{1.33}$ | Mg$_{0.04}$) O$_{12}$ |
| | (II) | {Nd$_{2.96}$ | | Mg$_{0.04}$} | [In$_{0.75}$ | Mg$_{1.25}$] | | (Ga$_{1.65}$ | Ge$_{1.32}$ | Mg$_{0.03}$) O$_{12}$ |
| | (III) | {0.2443} | {0.2531} | | [0.2107] | | | (0.1816) | | |
| | (IV) | 1.00 | | | 1.01 | 0.99 | | 1.01 | 0.99 | |

| Nr. | | $a_0$ calc nm | $a_0$ meas nm | $\{\bar{r}\}$ nm | $[\bar{r}]$ nm | $(\bar{r})$ nm | L mm | $\phi$ mm |
|---|---|---|---|---|---|---|---|---|
| 27 | (I) | 1.267 | | 0.11345 | 0.07442 | 0.04345 | | |
| | (II) | 1.266 | 1.2672 | | | | 35 | 15 |
| | (III) | | | | | | | |
| | (IV) | | | | | | | |
| 28 | (I) | 1.266 | | 0.11337 | 0.07375 | 0.04355 | | |
| | (II) | 1.266 | 1.2672 | | | | 40 | 15 |
| | (III) | | | | | | | |
| | (IV) | | | | | | | |
| 29 | (I) | 1.264 | | 0.11177 | 0.07467 | 0.04359 | | |
| | (II) | 1.264 | 1.2665 | | | | 62 | 18 |
| | (III) | | | | | | | |
| | (IV) | | | | | | | |

The method of the invention has the advantage that it is possible to produce both homogeneous, large single crystals and also polycrystalline material with homogeneous crystallites from oxidic multicomponent systems. By a suitable choice of the composition, determined by the ratio of the bond lengths of the cations in the first lattice site having the highest number of adjacent oxygen ions to the bond lengths of the cations in the second lattice site having the next lower number of adjacent oxygen, ions the distribution coefficients $k_{eff(kat)}$ of the cations can be adjusted to approximately 1, it is also possible to grow specific homogeneous mixed crystals having different compositions. The lattice constant a for the grown mixed crystals is continuously adjustable RE = a cation selected from the group consisting of Tb$^{3+}$, Dy$^{3+}$, Ho$^{3+}$ and Er$^{3+}$ R = In and/or RE and $0 \leq x \leq 0.55$ $0.01 \leq y \leq 0.28$ $0 \leq z \leq 0.55$ $0.15 \leq x + z \leq 0.60.$ 2. The mixed crystals as claimed in claim 1, characterized in that, the composition of the mixed crystals is defined by the general formula $$\{Tb_{3-x}Ca_x\}[Ga_{2-x-y-2z}Tb_yMg_zHf_{x+z}](Ga_3)O_{12}$$

wherein $0.05 \leq x \leq 0.35$ $0.02 \leq y \leq 0.03$ $0 \leq z \leq 0.55$ $0.35 \leq x+z \leq 0.60$.

3. The mixed crystals as claimed in claim 1, characterized in that, the composition of the mixed crystals is defined by the general formula $$\{Dy_{3-x}Ca_x\}[Ga_{2-x-y-2z}Dy_yMg_zHg_{x+z}](Ga_3)O_{12}$$

wherein $0.25 \leq x \leq 0.38$ $0.05 \leq y \leq 0.11$ $0 \leq z \leq 0.35$ $0.38 \leq x+z \leq 0.60$.

4. The mixed crystals as claimed in claim 1, characterized in that, the composition of the mixed crystals is defined by the general formula $$\{Er_{3-x}Ca_x\}[Ga_{2-x-y-2z}(Er,In)_yMg_zHf_{x+z}](Ga_3)O_{12}$$

wherein $0.49 \leq x \leq 0.55$ $0.18 \leq y \leq 0.28$ $0 \leq z \leq 0.11$ $0.55 \leq x+z \leq 0.60$.

5. A homogeneous mixed crystal, grown from melts of oxidic multi-component systems, comprising dodecahedral lattice sites and octahedral lattice sites wherein the band length ratio of dodecahedral cations to oxygen to that of octahedral cation to oxygen is in the range from 0.7–1.5 and having a composition of the formula $$\{Gd_{3-x}Ca_x\}[Ga_{2-x-y-2z}Gd_yMg_zHf_{x+z}](Ga_3)O_{12}$$

wherein $0 \leq x \leq 0.15$ $0.01 \leq y \leq 0.02$ $0 \leq z \leq 0.20$ $0.15 \leq x+z \leq 0.20$.

6. A homogeneous mixed crystal, grown from melts of oxidic multi-component systems, comprising dodecahedral lattice sites and octahedral lattice sites wherein the band length ratio of dodecahedral cations to oxygen to that of octahedral cation to oxygen is in the range from 0.7–1.5 and having a composition of the formula $$\{RE_{3-u-v}Ca_uMg_v\}[In_{2-w-x}Mg_wZr_x](Ga_{3-y-z}Ge_yMg_z)O_{12}$$

wherein
RE = a cation from the group $Pr^{r+}$, $Nd^{3+}$ and $0 \leq u \leq 0.60$ $0 \leq v \leq 0.06$ $1.25 \leq w \leq 1.50$ $0 \leq x \leq 0.50$ $1.32 \leq y \leq 1.60$ $0.03 \leq z \leq 0.15$.

7. The mixed crystals as claimed in claim 6, characterized in that the composition of the mixed crystals is defined by the general formula $$\{Pr_{3-u-v}Ca_uMg_v\}[In_{2-w-x}Mg_wZr_x](Ga_{3-y-z}Ge_yMg_z)O_{12}$$

wherein $0 \leq u \leq 0.20$ $0.03 \leq v \leq 0.06$ $1.33 \leq w \leq 1.36$ $0 \leq x \leq 0.25$ $1.47 \leq y \leq 1.50$ $0.08 \leq z \leq 0.15$.

8. The mixed crystals as claimed in claim 6, characterized in that the composition of the mixed crystals is defined by the general formula $$\{Nd_{3-u-v}Ca_uMg_v\}[In_{2-w-x}Mg_wZr_x](Ga_{3-y-z}Ge_yMg_z)O_{12}$$

wherein $0 \leq u \leq 0.60$ $0 \leq v \leq 0.08$ $1.26 \leq w \leq 1.50$ $0 \leq x \leq 0.50$ $1.33 \leq y \leq 1.60$ $0 \leq z \leq 0.10$.

9. A homogeneous mixed crystal, grown from melts of oxidic multi-component systems, comprising dodecahedral lattice sites and octahedral lattice sites wherein the bond length ratio of dodecahedral cations to oxygen to that of octahedral cation to oxygen is in the range from 0.7–1.5 and having a composition of the formula $$RE_{1-x}Sr_xGa_{1-y}Zr_yO_3$$

wherein
RE = a cation selected from the group consisting of $La^{3+}$, $Pr^{r+}$, $Nd^3$ and $0.05 \leq x \leq 0.10$ $0.05 \leq y \leq 0.10$.

10. The mixed crystals as claimed in claim 9, characterized in that a mixed crystal is grown from a melt composition defined by the formula $$La_{0.95}Sr_{0.05}Ga_{0.95}Zr_{0.05}O_3.$$

11. A homogeneous mixed crystal, grown from melts of oxidic multi-component systems, comprising dodecahedral lattice sites and octahedral lattice sites wherein the band length ratio of dodecahedral cations to oxygen to that of octahedral cation to oxygen is in the range from 0.7–1.5 and having a composition of the formula $$\{Tb_{3-x}Ca_x\}[Ga_{2-x-y-2z}Tb_yMg_zZr_{x+z}](Ga_3)O_{12}$$

wherein $0.50 \leq x \leq 0.58$ $0.07 \leq y \leq 0.10$ $0 \leq z \leq 0.08$ $0.58 \leq x+z \leq 0.60.$

* * * * *

UNITED STATES PATENT AND TRADEMARK OFFICE
CERTIFICATE OF CORRECTION

PATENT NO. : 5,302,559

DATED : April 12, 1994

INVENTOR(S) : Dieter Mateika, et al

Page 1 of 2

It is certified that error appears in the above-indentified patent and that said Letters Patent is hereby corrected as shown below:

```
Column 2, line 33, change "list" to --test--.
Column 3, line 33, change "[B-09" to --[B-0]--.
Column 5, line 19, change "Nanometers" to --nanometers--;
         line 25, change "nanometer" to --nanometers--.
Column 23, (claim 2) line 1, change "crystals" to --crystal--;
                     line 2, change "crystals" to --crystal--.
Column 23, (claim 3) line 1, change "crystals" to --crystal--;
                     line 2, change "crystals" to --crystal--;
                     line 5, change "(Ga_{3-}" to --(Ga_3)--;
                     line 6, delete ")".
Column 23, (claim 4) line 1, change "crystals" to --crystal--;
                     line 2, change "crystals" to --crystal--;
                     line 5, change "(Ga_{3-}" to --(Ga_3)--;
                     line 6, delete ")".
Column 23, (claim 5) line 8, change "(Ga_{3-}" to --(Ga_3)--;
                     line 9, delete ")".
Column 24, (claim 7) line 1, change "crystals" to --crystal--;
                     line 2, change "crystals" to --crystal--;
Column 24, (claim 8) line 1, change "crystals" to --crystal--;
                     line 2, change "crystals" to --crystal--.
```

UNITED STATES PATENT AND TRADEMARK OFFICE
CERTIFICATE OF CORRECTION

PATENT NO. : 5,302,559
DATED : April 12, 1994
INVENTOR(S) : Dieter Mateika, et al It is certified that error appears in the above-indentified patent and that said Letters Patent is hereby corrected as shown below:

Column 25, (claim 10) line 1, change "crystals" to --crystal--.

Signed and Sealed this

First Day of November, 1994

Attest:

BRUCE LEHMAN

*Attesting Officer*  *Commissioner of Patents and Trademarks*